United States Patent
O'Halloran et al.

(10) Patent No.: US 8,175,359 B2
(45) Date of Patent: *May 8, 2012

(54) ITERATIVE HIGHLY CONSTRAINED IMAGE RECONSTRUCTION METHOD

(75) Inventors: Rafael L. O'Halloran, Madison, WA (US); Sean B. Fain, Madison, WI (US); James H. Holmes, Madison, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 1050 days.

This patent is subject to a terminal disclaimer.

(21) Appl. No.: 12/032,262

(22) Filed: Feb. 15, 2008

(65) Prior Publication Data

US 2008/0199063 A1 Aug. 21, 2008

Related U.S. Application Data

(60) Provisional application No. 60/901,727, filed on Feb. 19, 2007.

(51) Int. Cl.
*G06K 9/00* (2006.01)
(52) U.S. Cl. .................................................. 382/131
(58) Field of Classification Search .................. 382/128, 382/131, 132; 324/307; 600/407, 410; 378/4, 378/901
See application file for complete search history.

(56) References Cited

U.S. PATENT DOCUMENTS

| | | | |
|---|---|---|---|
| 5,502,385 A | 3/1996 | Kuhn et al. | |
| 5,603,322 A | 2/1997 | Jesmanowicz et al. | |
| 5,604,778 A | 2/1997 | Polacin et al. | |
| 5,933,006 A | 8/1999 | Rasche et al. | |
| 6,490,472 B1 | 12/2002 | Li et al. | |
| 6,807,248 B2 | 10/2004 | Mihara et al. | |
| 6,954,067 B2 | 10/2005 | Mistretta | |
| 7,358,730 B2 | 4/2008 | Mistretta et al. | |
| 7,408,347 B2 | 8/2008 | Mistretta et al. | |
| 7,519,412 B2 | 4/2009 | Mistretta | |
| 7,545,901 B2 | 6/2009 | Mistretta | |
| 7,647,088 B2 | 1/2010 | Mistretta et al. | |
| 7,711,166 B2 | 5/2010 | Mistretta et al. | |
| 7,865,227 B2 | 1/2011 | Mistretta | |
| 2001/0027262 A1 | 10/2001 | Mistretta et al. | |
| 2003/0179918 A1 | 9/2003 | Kohler | |
| 2007/0038073 A1 | 2/2007 | Mistretta | |
| 2007/0167728 A1 | 7/2007 | Mistretta et al. | |

(Continued)

FOREIGN PATENT DOCUMENTS

EP 0627633 A1 7/1994

(Continued)

OTHER PUBLICATIONS

Wisconsin Alumni Research Foundation HYPE Portfolio Flow Chart; 3 pages; Jan. 19, 2011.

(Continued)

*Primary Examiner* — Jurie Yun
(74) *Attorney, Agent, or Firm* — Quarles & Brady LLP

(57) ABSTRACT

An image reconstruction method includes reconstructing an initial composite image of a subject using a conventional reconstruction method. The initial composite image employs the best information available regarding the subject of the scan and this information is used to constrain the reconstruction of a highly undersampled or low SNR image frames. This highly constrained image reconstruction is repeated a plurality of iterations with the reconstructed image frame for one iteration being used as the composite image for the next iteration. The reconstructed image frame rapidly converges to a final image frame.

21 Claims, 17 Drawing Sheets

U.S. PATENT DOCUMENTS

| | | | |
|---|---|---|---|
| 2008/0219535 | A1 | 9/2008 | Mistretta et al. |
| 2009/0076369 | A1 | 3/2009 | Mistretta |
| 2009/0129651 | A1 | 5/2009 | Zagzebski et al. |
| 2010/0286504 | A1 | 11/2010 | Mistretta et al. |

FOREIGN PATENT DOCUMENTS

| | | |
|---|---|---|
| WO | WO2005026765 A1 | 3/2005 |
| WO | WO2005069031 A1 | 7/2005 |

OTHER PUBLICATIONS

Wu et al; HYPR-TRICK: Highly Undersampled Hybrid Radial/Cartesian Acquisition with Highly Constrained Backprojection Reconstruction for Time Resolved MRI; Proc. Intl. Soc. Mag. Reson. Med. 14 (2006); 1 page.

Supanich et al; Dose Reduction in Neuro CT Exams Using Highly Constrained Back Projection (HYPR) Techniques; hppt://rsna2006.rsna.org; Nov. 30, 2006; 2 pages.

Mistretta, C.A.; Prospects for Acceleration and Dose Reduction in Selected MR and X-RAY CT Cardiovascular Applications; Proc. Intl. Soc. Mag. Reson. Med. 14 (2006); 1 page.

M. Griswold et al, More Optimal HYPR Reconstructions Using a Combination of HYPR and Conjugate-Gradient Minimization, p. 29, MR-Angioclub, Sep. 13, 2006.

H. Malcolm et al, Accelerated Image Reconstruction Using Ordered Subsets of Projection Data, IEEE Transactions on Medical Imaging, Dec. 1994, vol. 13, No. 4, p. 601-609.

P. Schmidlin et al, Subsets and Overrelaxation in Iterative Image Reconstruction, Pys. Med. Biol. 44 p. 1385-1396, (1999).

C. Badea et al, Experiments with the Nonlinear and Chaotic Behaviour of the Multiplicative Algebraic Reconstruction Technique (MART) Algorithm for Computer Tomography, Phy. Med. Biol. 49, p. 1455-1474, (2004).

Y. Huang et al, Time-Resolved 3D MR Angiography by Interleaved Biplane Projections, Proc. Intl. Soc. Mag. Reson. Med. 13 p. 1707 (2005).

T.A. Cashen et al, Comparison of Temporal and Spatial Undersampling Techniques for Time-Resolved Contrast-Enhanced MR Angiography, Proc. Intl. Soc. Mag. Reson. Med. 13, p. 380 (2005).

Graeme C. McKinnon et al, Towards Imaging the Beating Heart Usefully with a Conventional CT Scanner, IEEE Trans. on Biomedical Eng., vol. BME-28, No. 2, p. 123-127, Feb. 1981.

Kathryn L. Garden et al, 3-D Reconstruction of the Heart from few Projections: A Practical Implementation of the McKinnon-Bates Algorithm, IEEE Trans. on Biomedical Eng., vol. MI-5, No. 4, p. 233-234, Dec. 1986.

C.A. Mistretta et al, Highly Constrained Backprojection for Time-Resolved MRI, Mag. Reson. Med. 55:30-40 (2006).

Zhi-Pei Liang et al, Constrained Reconstruction Methods in MR Imaging, Reviews of Mag. Reson. in Med. vol. 4, pp. 67-185, 1992.

J.G. Pipe et al, Spiral Projection Imaging: a new fast 3D trajectory, Proc. Intl. Soc. Mag. Reson. Med. 13, p. 2402 (2005).

K.V. Koladia et al, Rapid 3D PC-MRA using Spiral Projection Imaging, Proc. Intl. Soc. Mag. Reson. Med. 13, p. 2405 (2005).

J. Tsao et al, k-t Blast and k-t Sense: Dynamic MRI With High Frame Rate Exploiting Spatiotemporal Correlations, Mag. Reson. Med. 50:1031-1042 (2003).

Zhi-Pei Liang et al, Constrained Imaging-Overcoming the Limitations of the Fourier Series, IEEE Engineering in Medicine and Biology, Sep./Oct. 1996, pp. 126-132.

Zhi-Pei Liang et al, Fast Algorithms for GS-Model-Based Image Reconstruction in Data-Sharing Fourier Imaging, IEEE Transactions on Med. Imaging, vol. 22, No. 8, pp. 1026-1030, Aug. 2003.

Klass P. Pruessmann et al, Advances in Sensitivity Encoding With Arbitrary k-Space Trajectories, Mag. Reson. in Med. 46:638-651 (2001).

R. Fahrig et al, Use of a C-Arm System to Generate True Three-dimensional Computed Rotational Angiograms: Preliminary in Vitro and in Vivo Results, AJNR: 18, pp. 1507-1514, Sep. 1997.

A.V. Barger, et al, Single Breath-Hold 3D Contrast-Enhanced Method for Assessment of Cardiac Function, Mag. Reson. in Med. 44:821-824 (2000).

J. Du et al, Time-Resolved Undersampled Projection Reconstruction Imaging for High-Resolution CE-MRA of the Distal Runoff Vessels, Mag. Reson. in Med. 48:516-522 (2002).

Ashwani Aggarwal et al, Imaging in Turbid Media by Modified Filtered Back Projection Method Using Data From Monte Carlo Simulation, Proc. of SPIE vol. 5047, pp. 314-324 (2003).

Xavier Golay, et al, Presto-Sense: An Ultrafast Whole-Brain fMRI Technique, Mag. Reson. in Med. 43:779-786 (2000).

Ronald R. Price, et al, Practical Aspects of Functional MRI (NMR Task Group #8), Medical Physics, vol. 29, No. 8, pp. 1892-1912, Aug. 2002.

M.S. Hansen et al, k-t Blast Reconstruction From Arbitrary k-t space Sampling: Application to Dynamic Radial Imaging, Proc. Intl. Soc. Mag. Reson. Med. (2003).

P. Schmidlin et al; Subsets and Overrelaxation in Iterative Image Reconstruction; Phys. Med. Biol. 44 (1999) 1385-1396.

C. Badea et al; Experiments With the Nonlinear and Chaotic Behavior of the Multiplicative Algebraic Reconstruction Technique (MART) Algorithm for Computed Tomography; Phys. Med. Biol. 49 (2004) 1455-1474.

R. Boubertakh et al., Dynamic Images Reconstruction using kt-Blast without Training Data, Proc. Intl. Soc. Med. 11 p. 343 (2004).

P. Irarrazaval et al., Reconstruction of Undersampled Dynamic Images Based on Time Frame Registration, Proc. Intl. Soc. Med. 11 p. 342 (2004).

J. Tsao et al., Optimized canonical sampling patterns in k-t space with two and three spatial dimensions for k-t Blast and k-t, Proc. Intl. Soc. Med. 11 p. 261 (2004).

M. S. Hansen et al., A study of the spatial-temporal tradeoff in k-t Blast reconstruction, Proc. Intl. Soc. Med. 11 p. 536 (2004).

J. Tsao et al., Moving-buffer k-t Blast for real-time reconstruction: Cartesian & simplified radial cases, Proc. Intl. Soc. Med. 11 p. 635 (2004).

F. Huang et al., Reconstruction with Prior Information for Dynamic MRI, Proc. Intl. Soc. Med. 11 p. 2680 (2004).

D. Mitsouras et al., Accelerated MR Imaging via Folding the non-Fourier Encoded Dimensions, Proc. Intl. Soc. Med. 11 p. 2092 (2004).

P. C. Lauterbur and Z. Liang, et al., Magnetic Resonance Imaging with a priori Constraints: Possibilities and Limitations, IEEE Engineering in Medicine and Biology Society, 1996.

C. Baltes et al., Considerations on training data in k-t Blast / k-t Sense accelerated quantitative flow measurements, Proc. Intl. Soc. Mag. Reson. Med. 13 p. 383 (2005).

M. S. Hansen et al., On the Influence of Training Data Quality in k-t Blast Reconstruction, Mag. Reson. Med. 52:1175-1183 (2004).

M. Lustig et al., k-t Sparse: High Frame Rate Dynamic MRI Exploiting Spatio-Temporal Sparsity, Proc. Intl. Soc. Mag. Reson. Med 14 (2006).

J. Tsao et al., Unifying Linear Prior-Information-Driven Methods for Accelerated Image Acquisition, Mag. Reson. Med. 46:652-660 (2001).

Q. Xiang and R.M. Henkelman, K-Space Description for MR Imaging of Dynamic Objects, Mag. Reson. Med. 29:422-428 (1993).

M. Lustig et al., Rapid MR Imaging with Compressed Sensing and Randomly Under-Sampled 3DFT Trajectories, Proc. Intl. Soc. Mag. Reson. Med. 14 (2006).

S. Krishnan and T. L. Chenevert, Spatio-Temporal Bandwidth-Based Acquisition for Dynamic Contrast-Enhanced Magnetic Resonance Imaging, J. Mag. Reson. Imaging 20:129-137 (2004).

M. S. Hansen et al., k-t Blast Reconstruction From Non-Cartesian k-t Space Sampling, Mag. Reson. Med. 55:85-91 (2006).

A. G. Webb et al., Application of Reduced-Encoding MR Imaging with Generalized-Series Reconstruction (RIGR), J. Mag. Reson. Imaging 3:925-928 (1993).

B. Madore and M. J. Pelc, New Approach to 3D Time-Resolved Angiography, Mag. Reson. Med. 47:1022-1025 (2002).

J. Tsao et al., Optimizing Spatiotemporal Sampling for k-t Blast and k-t Sense: Application to High-Resolution Real-Time Cardiac Steady-State Free Precession, Mag. Reson. Med. 53:1372-1382 (2005).

W. Nowinski, The Iterated Normalized Backprojection Method of Image Reconstruction, Inst. of Computer Science, Ordona 21, 01-237 Warsaw, Poland; CAIP '93 Proceedings of the 5th International Conference on Computer Analysis of Images and Patterns-,Springer-Verlag London, UK Oct. 8, 1993 in vol. 719 of Lecture Notes in Computer Science.

L. Launay et al; 3D Reconstruction of Cerebral Vessels and Pathologies From a Few Biplane Digital Angiographies; XP001247778, pp. 123-128, VBC '96 Proceedings of the 4th International Conference on Visualization in Biomedical Computing,Springer-Verlag London, UK Sep. 30, 1996 in vol. 1131 of Lecture Notes in Computer Science.

A.L. Wentland et al, Technique for Acquiring MR Images of CSF Flow During a Valsalva Maneuver, Med. Phys. Univ. of WI, Madison WI, Presented at Proceedings 14th Scientific Meeting International Society for Magnetic Resonance in Medicine Proc. Intl. Soc. Mag. Reson. Med. 14 (2006).

K.M. Johnson et al, Average and Time-Resolved Dual Velocity Encoded Phase Contrast Vastly Undersampled Isotropic Projection Imaging, Med. Phys. Univ. of WI, Madison WI, Presented at Proceedings 14th Scientific Meeting International Society for Magnetic Resonance in Medicine Proc. Intl. Soc. Mag. Reson. Med. 14 (2006).

K.M. Johnson et al, Transtenotic Pressure Gradient Measurements Using Phase Contrast Vastly Undersampled Isotropic Projection Imaging (PC-VIPR) in a Canine Model, Med. Phys. Univ. of WI, Madison WI, Presented at Proceedings 14th Scientific Meeting International Society for Magnetic Resonance in Medicine Proc. Intl. Soc. Mag. Reson. Med. 14 (2006).

Wisconsin Alumni Research Foundation HYPE Portfolio Flow Chart; 3 pages; Nov. 17, 2011.

FIG. 2A
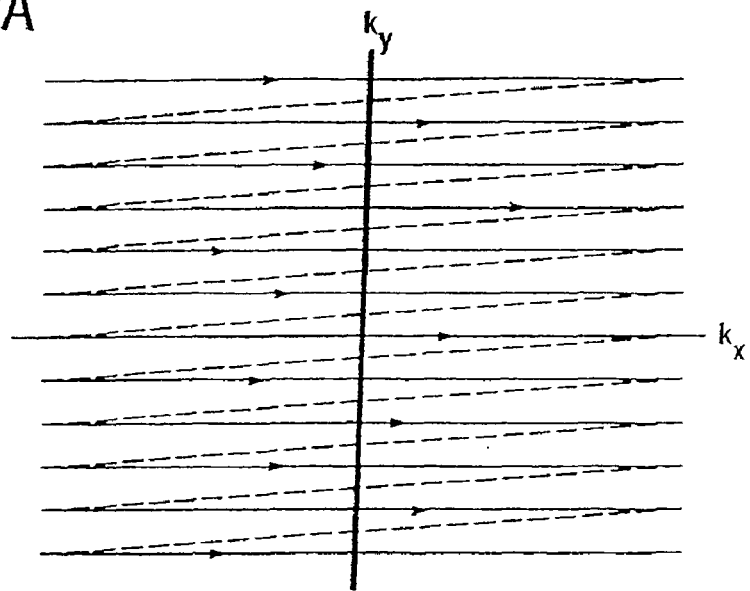
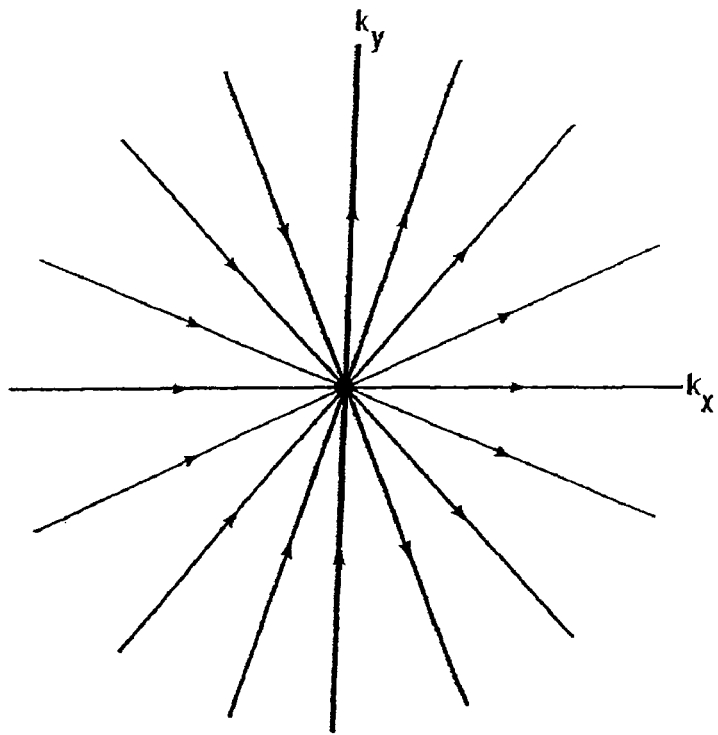
FIG. 2B

ITERATIVE HIGHLY CONSTRAINED IMAGE RECONSTRUCTION METHOD

CROSS-REFERENCE TO RELATED APPLICATIONS

This application is based on U.S. Provisional Patent Application Ser. No. 60/901,727 filed on Feb. 19, 2007 and entitled "Iterative Highly Constrained Image Reconstruction Method."

STATEMENT REGARDING FEDERALLY SPONSORED RESEARCH

This invention was made with government support under Grant No. DK073680 awarded by the National Institute of Health. The United States Government has certain rights in this invention.

BACKGROUND OF THE INVENTION

The field of the invention is imaging and particularly, methods for reconstructing images from acquired image data.

Magnetic resonance imaging (MRI) uses the nuclear magnetic resonance (NMR) phenomenon to produce images. When a substance such as human tissue is subjected to a uniform magnetic field (polarizing field $B_0$), the individual magnetic moments of the spins in the tissue attempt to align with this polarizing field, but process about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins, and after the excitation signal $B_1$ is terminated, this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. Each measurement is referred to in the art as a "view" and the number of views determines the quality of the image. The resulting set of received NMR signals, or views, or k-space samples, are digitized and processed to reconstruct the image using one of many well known reconstruction techniques. The total scan time is determined in part by the length of each measurement cycle, or "pulse sequence", and in part by the number of measurement cycles, or views, that are acquired for an image. There are many clinical applications where total scan time for an image of prescribed resolution and SNR is a premium, and as a result, many improvements have been made with this objective in mind.

Projection reconstruction methods have been known since the inception of magnetic resonance imaging and this method is again being used as disclosed in U.S. Pat. No. 6,487,435. Rather than sampling k-space in a rectilinear, or Cartesian, scan pattern as is done in Fourier imaging and shown in FIG. 2A, projection reconstruction methods sample k-space with a series of views that sample radial lines extending outward from the center of k-space as shown in FIG. 2B. The number of views needed to sample k-space determines the length of the scan and if an insufficient number of views are acquired, streak artifacts are produced in the reconstructed image. The technique disclosed in U.S. Pat. No. 6,487,435 reduces such streaking by acquiring successive undersampled images with interleaved views and sharing peripheral k-space data between successive image frames.

In a computed tomography ("CT") system, an x-ray source projects a fan-shaped beam which is collimated to lie within an X-Y plane of a Cartesian coordinate system, termed the "image plane." The x-ray beam passes through the object being imaged, such as a medical patient, and impinges upon an array of radiation detectors. The intensity of the transmitted radiation is dependent upon the attenuation of the x-ray beam by the object and each detector produces a separate electrical signal that is a measurement of the beam attenuation. The attenuation measurements from all the detectors are acquired separately to produce what is called the "transmission profile".

The source and detector array in a conventional CT system are rotated on a gantry within the imaging plane and around the object so that the angle at which the x-ray beam intersects the object constantly changes. The transmission profile from the detector array at a given angle is referred to as a "view" and a "scan" of the object comprises a set of views made at different angular orientations during one revolution of the x-ray source and detector. In a 2D scan, data is processed to construct an image that corresponds to a two dimensional slice taken through the object.

As with MRI, there are a number of clinical applications for x-ray CT where scan time is at a premium. In time-resolved angiography, for example, a series of image frames are acquired as contrast agent flows into the region of interest. Each image is acquired as rapidly as possible to obtain a snapshot that depicts the inflow of contrast. This clinical application is particularly challenging when imaging coronary arteries or other vessels that require cardiac gating to suppress motion artifacts.

There are two methods used to reconstruct images from an acquired set of projection views as described, for example, in U.S. Pat. No. 6,710,686. In MRI the most common method is to regrid the k-space samples from their locations on the radial sampling trajectories to a Cartesian grid. The image is then reconstructed by performing a 2D or 3D Fourier transformation of the regridded k-space samples. The second method for reconstructing an MR image is to transform the radial k-space projection views to Radon space by first Fourier transforming each projection view. An image is reconstructed from these signal projections by filtering and back-projecting them into the field of view (FOV). As is well known in the art, if the acquired signal projections are insufficient in number to satisfy the Nyquist sampling theorem, streak artifacts are produced in the reconstructed image.

The prevailing method for reconstructing an image from 2D x-ray CT data is referred to in the art as the filtered backprojection technique. This backprojection process is essentially the same as that used in MR image reconstruction discussed above and it converts the attenuation signal measurements acquired in the scan into integers called "CT numbers" or "Hounsfield units", which are used to control the brightness of a corresponding pixel on a display.

The standard backprojection method used in both the MRI and x-ray CT is graphically illustrated in FIG. 3. Each acquired signal projection profile 10 is backprojected onto the field of view 12 by projecting each signal sample 14 in the profile 10 through the FOV 12 along the projection path as indicted by arrows 16. In backprojecting each signal sample 14 into the FOV 12 no a priori knowledge of the subject being imaged is used and the assumption is made that the signals in the FOV 12 are homogeneous and that the signal sample 14 should be distributed equally in each pixel through which the projection path passes. For example, a projection path 8 is illustrated in FIG. 3 for a single signal sample 14 in one signal projection profile 10 as it passes through N pixels in the FOV 12. The signal value (P) of this signal sample 14 is divided up equally between these N pixels:

$$S_n = (P \times 1)/N \quad (1)$$

where: $S_n$ is the signal value distributed to the $n^{th}$ pixel in a projection path having N pixels.

Clearly, the assumption that the backprojected signal in the FOV 12 is homogeneous is not correct. However, as is well known in the art, if certain corrections are made to each signal profile 10 and a sufficient number of profiles are acquired at a corresponding number of projection angles, the errors caused by this faulty assumption are minimized and image artifacts are suppressed. In a typical, filtered backprojection method of image reconstruction, 400 projections are required for a 256×256 pixel 2D image and 103,000 projections are required for a 256×256×256 voxel 3D image.

Recently a new image reconstruction method known in the art as "HYPR" and described in co-pending U.S. patent application Ser. No. 11/482,372, filed on Jul. 7, 2006 and entitled "Highly Constrained Image Reconstruction Method" was disclosed and is incorporated by reference into this application. With the HYPR method a composite image is reconstructed from acquired data to provide a priori knowledge of the subject being imaged. This composite image is then used to highly constrain the image reconstruction process. HYPR may be used in a number of different imaging modalities including magnetic resonance imaging (MRI), x-ray computed tomography (CT), positron emission tomography (PET), single photon emission computed tomography (SPECT) and digital tomosynthesis (DTS).

As shown in FIG. 1, for example, when a series of time-resolved images 2 are acquired in a dynamic study, each image frame 2 may be reconstructed using a very limited set of acquired views. However, each such set of views is interleaved with the views acquired for other image frames 2, and after a number of image frames have been acquired, a sufficient number of different views are available to reconstruct a quality composite image 3 for use according to the HYPR method. A composite image 3 formed by using all the interleaved projections is thus much higher quality, and this higher quality is conveyed to the image frame by using the highly constrained image reconstruction method 4. The image frames 2 may also be acquired in a dynamic study in which the dosage (e.g., x-ray) or exposure time (e.g., PET or SPECT) is reduced for each image frame. In this case the composite image is formed by accumulating or averaging measurements from the series of acquired image frames. The highly constrained reconstruction 4 of each image frame 2 conveys the higher SNR of this composite image to the resulting reconstructed image.

A discovery of the HYPR method is that good quality images can be produced with far fewer projection signal profiles if a priori knowledge of the signal contour in the FOV 12 is used in the reconstruction process. Referring to FIG. 4, for example, the signal contour in the FOV 12 may be known to include structures such as blood vessels 18 and 20. That being the case, when the backprojection path 8 passes through these structures a more accurate distribution of the signal sample 14 in each pixel is achieved by weighting the distribution as a function of the known signal contour at that pixel location. As a result, a majority of the signal sample 14 will be distributed in the example of FIG. 4 at the backprojection pixels that intersect the structures 18 and 20. For a back projection path 8 having N pixels this highly constrained backprojection may be expressed as follows:

$$S_n = (P \times C_n) / \sum_{n=1}^{N} C_n \quad (2)$$

where: $S_n$=the backprojected signal magnitude at a pixel n in an image frame being reconstructed;

P=the signal sample value in the projection profile being backprojected; and $C_n$=signal value of an a priori composite image at the $n^{th}$ pixel along the backprojection path. The composite image is reconstructed from data acquired during the scan, and may include that used to reconstruct the image frame as well as other acquired image data that depicts the structure in the field of view. The numerator in equation (2) weights each pixel using the corresponding signal value in the composite image and the denominator normalizes the value so that all backprojected signal samples reflect the projection sums for the image frame and are not multiplied by the sum of the composite image.

While the normalization can be performed on each pixel separately after the backprojection, in many clinical applications it is far easier to normalize the projection P before the backprojection. In this case, the projection P is normalized by dividing by the corresponding value $P_c$ in a projection through the composite image at the same view angle. The normalized projection P/PC is then backprojected and the resulting image is then multiplied by the composite image.

A 3D embodiment of the highly constrained backprojection is shown pictorially in FIG. 5 for a single 3D projection view characterized by the view angles θ and φ. This projection view is back projected along axis 16 and spread into a Radon plane 21 at a distance r along the back projection axis 16. Instead of a filtered back projection in which projection signal values are filtered and uniformly distributed into the successive Radon planes, along axis 16, the projection signal values are distributed in the Radon plane 21 using the information in the composite image. The composite image in the example of FIG. 5 contains vessels 18 and 20. The weighted signal contour value is deposited at image location x, y, z in the Radon plane 21 based on the intensity at the corresponding location x, y, z in the composite image. This is a simple multiplication of the backprojected signal profile value P by the corresponding composite image voxel value. This product is then normalized by dividing the product by the projection profile value from the corresponding image space projection profile formed from the composite image. The formula for the 3D reconstruction is $$I(x,y,z) = \Sigma (P(r,\theta,\phi) * C(x,y,z)_{(r,\theta,\phi)} / P_c(r,\theta,\phi)$$

where the sum (Σ) is over all projections in the image frame being reconstructed and the x, y, z values in a particular Radon plane are calculated using the projection profile value $P(r,\theta,\phi)$ at the appropriate r,θ,φ value for that plane. $P_c(r,\theta,\phi)$ is the corresponding projection profile value from the composite image, and $C(x,y,z)_{r,\theta,\phi}$ is the composite image value at (r,θ,φ).

The HYPR method was developed initially for reconstructing images from under sampled sets of projection views. As indicated in co-pending vs. patent application Ser. No. 60/901,728 filed on Feb. 19, 2007 and entitled "Localized and Highly Constrained Image Reconstruction Method", the HYPR method can also be used to reconstruct images acquired with views other than projection views. In addition, it has been discovered that if a composite image having a high signal-to-noise-ratio ("SNR") is used in the HYPR method, the SNR of the HYPR reconstructed image is improved. The HYPR method thus not only reduces image artifacts due to under sampling, but also improves image quality regardless of the degree of sampling used.

The HYPR method works well under certain circumstances. First, HYPR works best with "sparse" data sets in which the subject of interest in the field of view occupies a small fraction of the image space. It works well with contrast enhanced magnetic resonance angiography, for example, because the signals from stationary tissues are subtracted from the data set leaving only the desired signals depicting the vasculature. And second, HYPR works well with subjects that do not move during the data acquisition.

SUMMARY OF THE INVENTION

The present invention is a new method for reconstructing images, and particularly, an improved method for reconstructing an image from acquired views of the subject or an acquired image frame. The HYPR method is employed to reconstruct an image frame using an image frame data set and an initial composite image, and this HYPR process is then repeated with the reconstructed image frame produced during one iteration substituted for the composite image used in the following iteration. The reconstructed image frame rapidly converges to an accurate depiction of the subject at the moment the undersampled k-space data set or image frame was acquired.

A general object of the invention is to enhance the HYPR image reconstruction method for use when non-sparse k-space data sets are acquired. By iteratively performing a HYPR reconstruction on the k-space data set with a continuously improving composite image, the composite image converges to a high quality image despite the presence of many structures in the field of view.

Another object of the invention is to reconstruct an image frame of a moving subject using the HYPR reconstruction method. A composite image may be formed from a number of image frames in a window of time surrounding the acquired image frame to be reconstructed. Even though the subject in the composite image may be blurred due to subject motion, it rapidly converges to a focused, quality image when it is used to initiate an iterative HYPR reconstruction with the acquired image frame. The subject is depicted at its location the moment the image frame was acquired and this moment can be changed by using other acquired image frames as input to the iterative HYPR reconstruction.

Another object of the invention is to increase the SNR of an image reconstructed using the HYPR method. Rather than using a combination of acquired image frames to form the composite image, a separate, high SNR image acquisition may be used as the initial composite image for the iterative HYPR reconstruction. During the iterative HYPR process the composite image converges to depict the subject at the moment the image frame used in the reconstruction was acquired and it retains the high SNR of the composite image.

Yet another object of the invention is to improve the HYPR image reconstruction method by performing all calculations using complex numbers. As a result, phase information is preserved in the reconstructed image frame.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 2A is a graphic illustration of the manner in which k-space is sampled during a typical Fourier, or spin-warp, image acquisition using an MRI system;

FIG. 2B is a graphic illustration of the manner in which k-space is sampled during a typical projection reconstruction image acquisition using an MRI system;

GENERAL DESCRIPTION OF THE INVENTION

Figure 1:
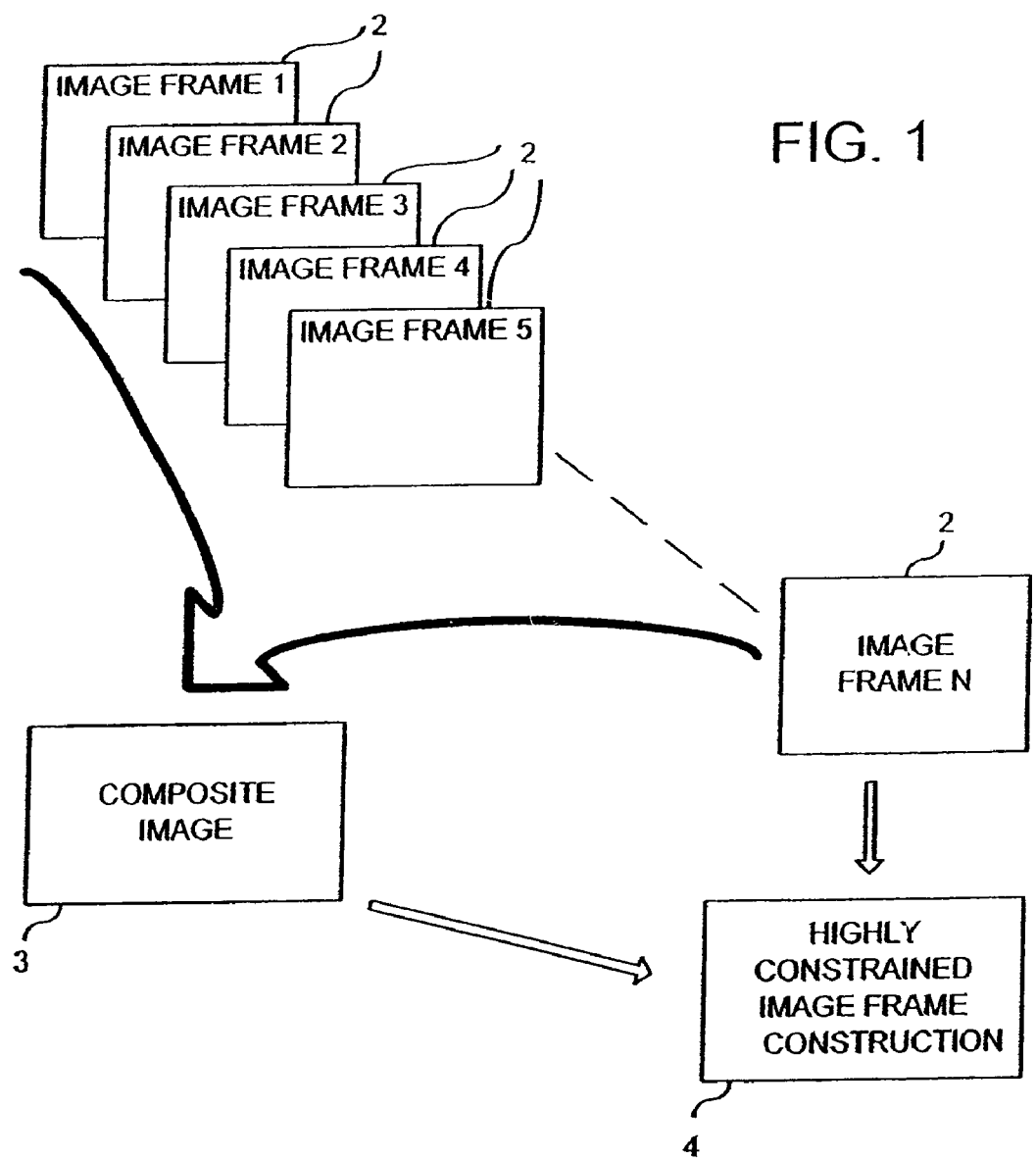
FIG. 1 is a pictorial view illustrating the application of the present invention to medical imaging applications.
Figure 3:
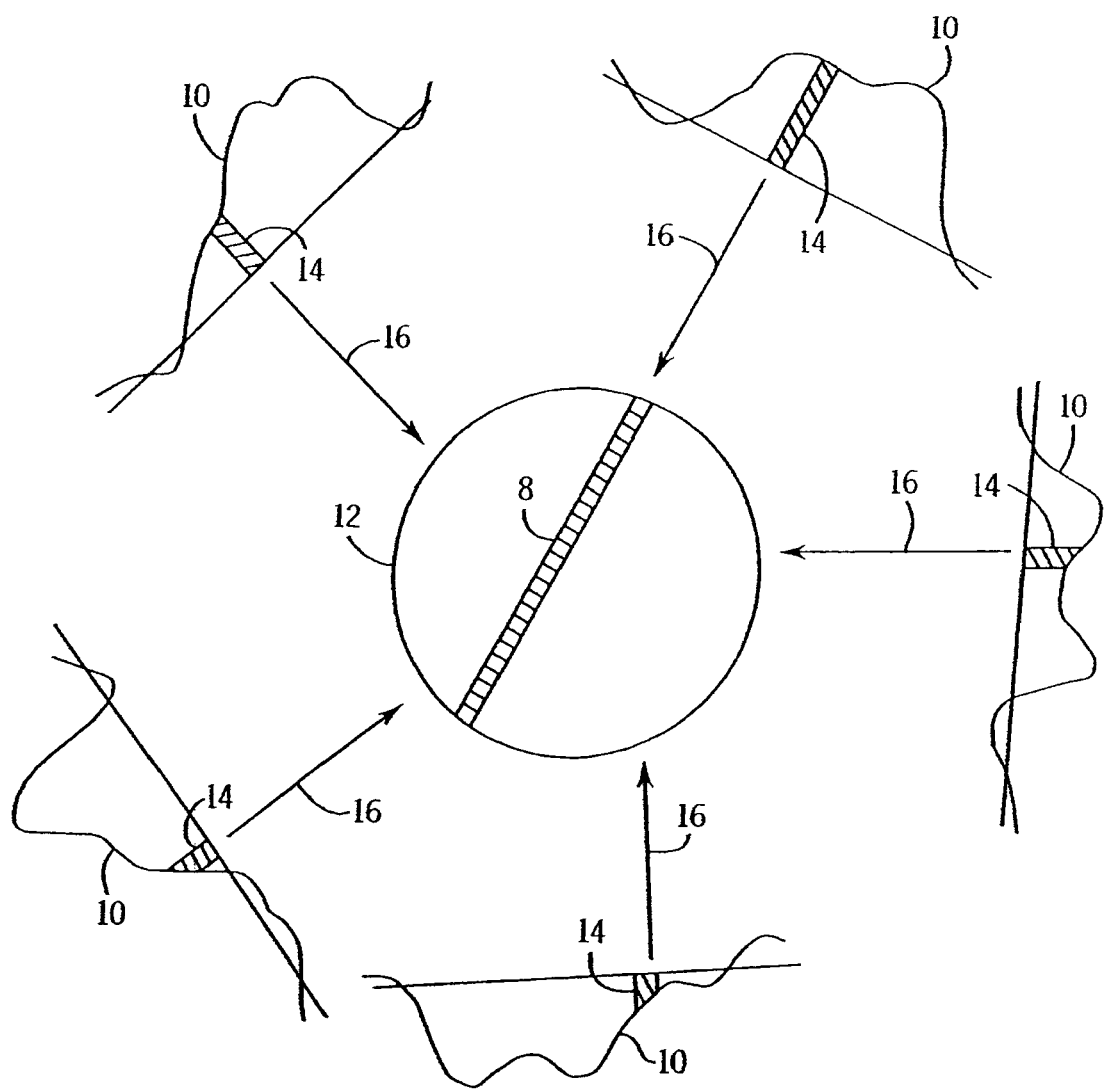
FIG. 3 is a pictorial representation of a conventional backprojection step in an image reconstruction process.
Figure 9:
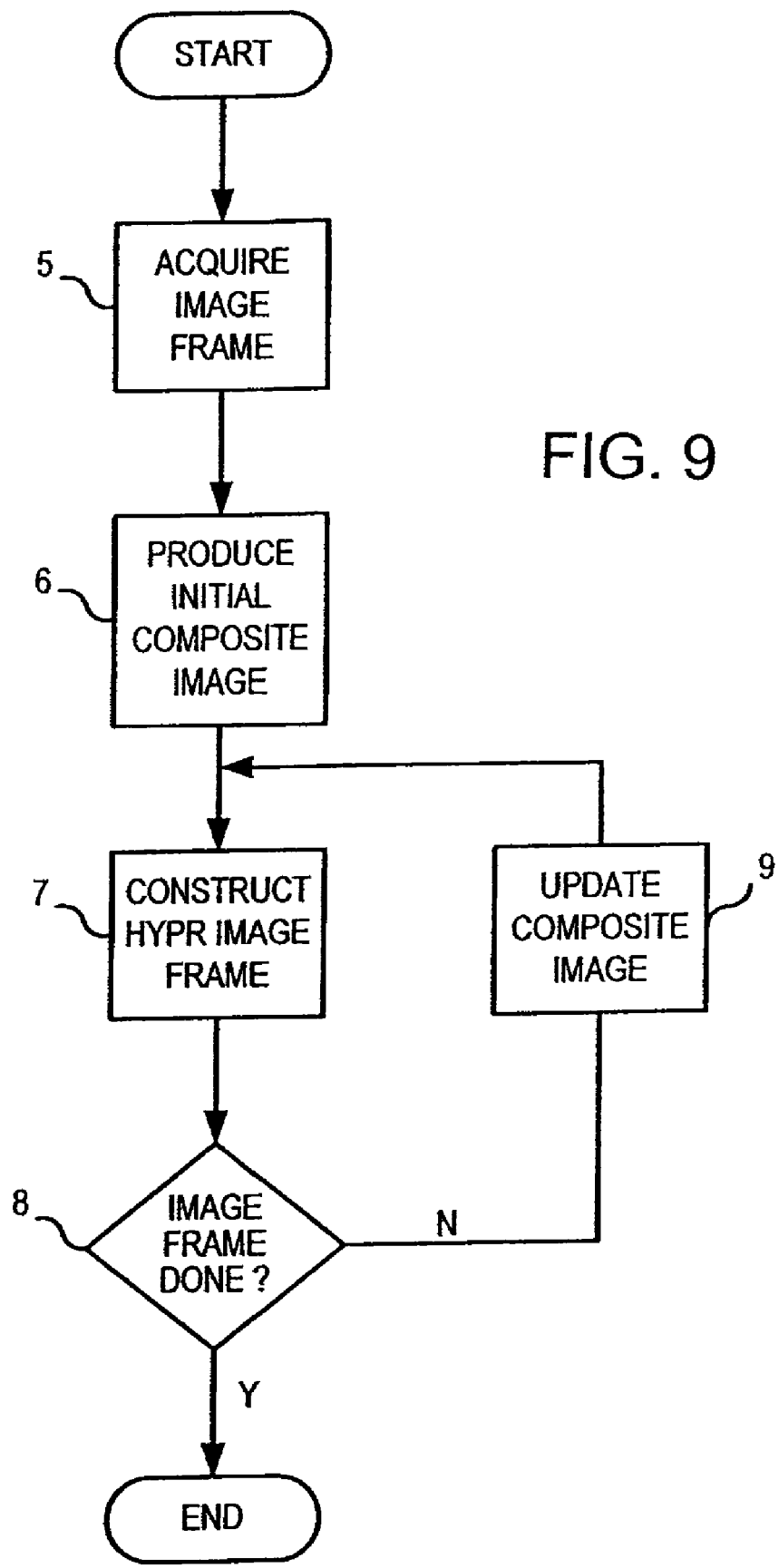
FIG. 9 is a flow chart of the steps used to practice the present invention.

Referring particularly to FIGS. 1 and 9, the present invention is a modification of the HYPR image reconstruction method which enables it to be used in challenging clinical applications. As with HYPR, an image frame 2 is acquired as indicated at process block 5. The image frame 2 may be acquired with any number of different imaging modalities such as MRI, CT, PET, SPECT or ultrasound. The image frame 2 is characterized by the fact that it may be a set of views which undersample the subject being imaged or it may be an image frame which has a low SNR due to the manner it was acquired.

The method also includes the production of an initial composite image 3 as indicated by process block 6. The composite image 3 may be acquired in any number of different ways, but it is characterized by the fact that it is of much higher quality than the image frame 2. It may be of higher quality due to a more complete sampling of the object to be imaged or it may have a higher SNR due, for example, to a longer acquisition time or to the use of higher acquisition dose. In some clinical applications the composite image 3 may be produced by combining the data from a plurality of acquired image frames.

Referring still to FIGS. 1 and 9, the composite image 3 is used to construct a high quality image frame using the HYPR process as indicated at process block 7. As will be discussed in more detail below a number of HYPR processing methods may be employed for this step, the choice being determined primarily by the nature of the acquired image frame 2. For example, if the image frame is a set of projection views the HYPR method disclosed in co-pending U.S. patent application Ser. No. 11/482,372 filed on Jul. 7, 2006 and entitled "Highly Constrained Image Reconstruction Method" may be employed. On the other hand, where the image frame 2 is in another form, one may prefer to use the HYPR process disclosed in co-pending U.S. patent application Ser. No. 60/901,728 filed on Feb. 19, 2007 and entitled "Localized and Highly Constrained Image Reconstruction Method." The disclosures in both of these patent applications are incorporated herein by reference.

The next step as indicated at decision block 8 is to determine if the final image frame is completed. If not, as indicated at process block 9, the composite image is updated using the non-final image frame. That is, the non-final image frame produced in process step 7 is substituted as the updated composite image and the system loops back to repeat the HYPR reconstruction step 7 using the original image frame 2 and the updated composite image. This iterative process is repeated until the final image frame reaches the desired quality as determined at decision block 8. The number of iterations required to produce the final image frame will depend on the particular clinical application. The iterative HYPR process has been shown to improve accuracy in a number of accelerated imaging applications including contrast enhanced MR angiography, MR cerebral perfusion (O'Halloran et al. MRM 59:132-139, 2008) (1 to 3 iterations), Diffusion-weighted Hyperpolarized He-3 MRI of the lung (O'Halloran et al. ISMRM 2007 Abstract 3363) (4 iterations) and T2* mapping in the human knee (Jacobson et al. submitted to ISMRM 2008) (3 iterations).

It has been discovered that as this iterative HYPR process proceeds the quality of the reconstructed image frame improves with each iteration. Artifacts due to undersampling become further suppressed with each iteration and the higher SNR of the initial composite image is further conveyed to the image frame with each iteration. Importantly, however, the particular characteristics of the initial acquired image frame are not lost in this iterative process. For example, the position of the subject at the moment the image frame was acquired is retained despite subject motion over time. Similarly, the time resolution of the acquired image frame is retained to show the subject at the moment of acquisition despite changes such as the inflow of a contrast agent over time.

It can be demonstrated that the SNR of each HYPR reconstructed image frame is dominated by the SNR of the composite image. SNR is calculated as the ratio of object signal level to the noise standard deviation within the object and CNR is calculated as the difference between the object and background signal levels divided by the standard deviation of the background noise. The overall SNR and CNR are limited by a combination of the stochastic noise and the noise due to the streak artifacts. It can be shown that the stochastic component of the SNR in the highly constrained backprojection reconstruction is given by:

$$SNR_{HYPR} = SNR_{composite}/[1+N_f/N_v^2+N_{pix}/(N_pN_v^2)]^{1/2} \quad (3)$$

where $SNR_{composite}$ is the SNR in the composite image, $N_f$ is the number of image frames in the time series, $N_v$ is the number of object pixels in the projection, $N_{pix}$ is the number of pixels in the projection (e.g., 256 for 2D or 256×256 for 3D), and $N_p$ is the number of projections per image frame. If $N_p$ is on the order of 10 the SNR is dominated by $SNR_{composite}$. The iterative method improves the quantitative accuracy of the image while maintaining or improving the SNR of the reconstructed image frame. This has been demonstrated in simulations where the maximum SNR in the projection data is 10.

Phase information is accurately preserved when the iterative HYPR reconstruction is performed using complex numbers rather than magnitudes. Phase information is acquired when using an MRI system and is in the form of a complex value (I and Q) at each k-space sample point. HYPR involves only four operations: multiplication; division; Radon transform; and filtered back-projection. All of these operations can be done using complex numbers.

Multiplication of two complex values $Ae^{i\Phi A}$ and $Be^{i\Phi B}$ can be expressed in the Euler form as follows:

$$Ae^{i\Phi A} \times Be^{i\Phi B} = A/Be^{i(\Phi A+\Phi B)}$$

where A and B are the magnitudes of the two complex numbers. Similarly, division can be expressed as follows:

$$Ae^{-i\Phi A}/Be^{i\Phi B} = A/Be^{i(\Phi A-\Phi B)}$$

In both operations the magnitude values are preserved as well as the phase information.

The forward and backward projection operations associated with a Radon transform are essentially addition and subtraction operations. Such operations can be performed on the real and imaginary components Q and I of the complex values separately and then recombined to form a complex number result. The magnitude value is retained as $M=\sqrt{I^2+Q^2}$ and the phase information is preserved as $\Phi=\tan^{-1} Q/I$. Similarly, filter operations are real and a filtered backprojection operation can be performed separately on the real and imaginary components of complex values to produce accurate magnitude and phase values.

DETAILED DESCRIPTION OF THE PREFERRED EMBODIMENT

The present invention may be applied to many different medical imaging modalities and to many different clinical applications. A number of these clinical applications of the invention are described below to illustrate the broad scope of the present invention.

Figure 6:
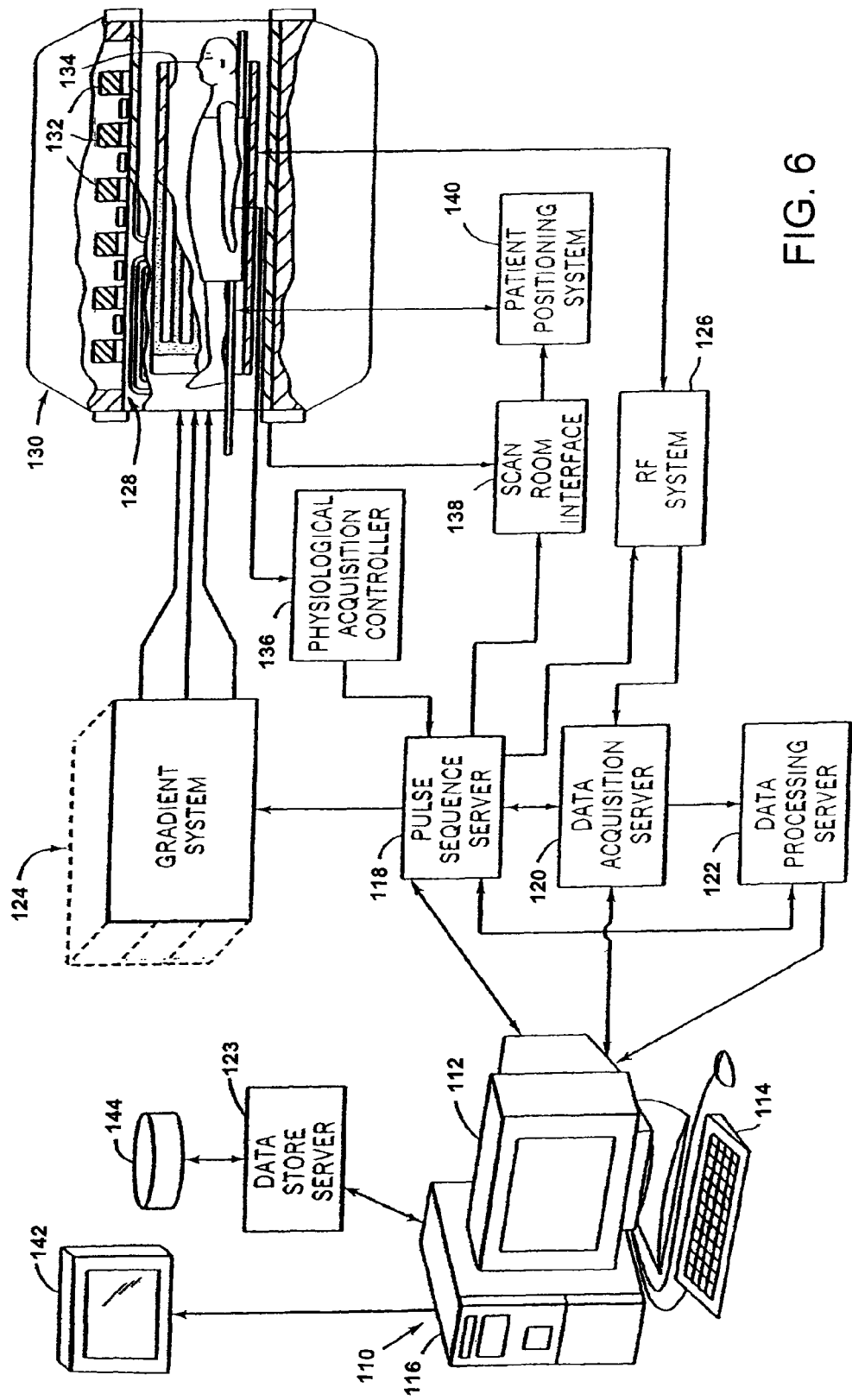
FIG. 6 is a block diagram of a magnetic resonance imaging (MRI) system used to practice the present invention.

Referring particularly to FIG. 6, a preferred embodiment of the invention is employed in an MRI system. The MRI system includes a workstation 110 having a display 112 and a keyboard 114. The workstation 110 includes a processor 116 which is a commercially available programmable machine running a commercially available operating system. The workstation 110 provides the operator interface which enables scan prescriptions to be entered into the MRI system.

The workstation 110 is coupled to four servers: a pulse sequence server 118; a data acquisition server 120; a data processing server 122, and a data store server 123. In the preferred embodiment the data store server 123 is performed by the workstation processor 116 and associated disc drive interface circuitry. The remaining three servers 118, 120 and 122 are performed by separate processors mounted in a single enclosure and interconnected using a 64-bit backplane bus. The pulse sequence server 118 employs a commercially available microprocessor and a commercially available quad communication controller. The data acquisition server 120 and data processing server 122 both employ the same commercially available microprocessor and the data processing server 122 further includes one or more array processors based on commercially available parallel vector processors.

The workstation 110 and each processor for the servers 118, 120 and 122 are connected to a serial communications network. This serial network conveys data that is downloaded to the servers 118, 120 and 122 from the workstation 110 and it conveys tag data that is communicated between the servers and between the workstation and the servers. In addition, a high speed data link is provided between the data processing server 122 and the workstation 110 in order to convey image data to the data store server 123.

The pulse sequence server 118 functions in response to program elements downloaded from the workstation 110 to operate a gradient system 124 and an RF system 126. Gradient waveforms necessary to perform the prescribed scan are produced and applied to the gradient system 124 which excites gradient coils in an assembly 128 to produce the magnetic field gradients $G_x$, $G_y$ and $G_z$ used for position encoding NMR signals. The gradient coil assembly 128 forms part of a magnet assembly 130 which includes a polarizing magnet 132 and a whole-body RF coil 134.

RF excitation waveforms are applied to the RF coil 134 by the RF system 126 to perform the prescribed magnetic resonance pulse sequence. Responsive NMR signals detected by the RF coil 134 are received by the RF system 126, amplified, demodulated, filtered and digitized under direction of commands produced by the pulse sequence server 118. The RF system 126 includes an RF transmitter for producing a wide variety of RF pulses used in MR pulse sequences. The RF transmitter is responsive to the scan prescription and direction from the pulse sequence server 118 to produce RF pulses of the desired frequency, phase and pulse amplitude waveform. The generated RF pulses may be applied to the whole body RF coil 134 or to one or more local coils or coil arrays.

The RF system 126 also includes one or more RF receiver channels. Each RF receiver channel includes an RF amplifier that amplifies the NMR signal received by the coil to which it is connected and a quadrature detector which detects and digitizes the I and Q quadrature components of the received NMR signal. The magnitude of the received NMR signal may thus be determined from this complex number at any sampled point by calculating the square root of the sum of the squares of the I and Q components:

$$M=\sqrt{I^2+Q^2}.$$

The phase of the received NMR signal is preserved in this complex number and may also be determined:

$$\phi=\tan^{-1}Q/I.$$

In the description below various calculations are performed and it should be understood that these calculations are performed on complex numbers so that both the magnitude and phase information is preserved throughout.

The pulse sequence server 118 also optionally receives patient data from a physiological acquisition controller 136. The controller 136 receives signals from a number of different sensors connected to the patient, such as ECG signals from electrodes or respiratory signals from a bellows. Such signals are typically used by the pulse sequence server 118 to synchronize, or "gate", the performance of the scan with the subject's respiration or heart beat.

The pulse sequence server 118 also connects to a scan room interface circuit 138 which receives signals from various sensors associated with the condition of the patient and the magnet system. It is also through the scan room interface circuit 138 that a patient positioning system 140 receives commands to move the patient to desired positions during the scan.

It should be apparent that the pulse sequence server 118 performs real-time control of MRI system elements during a scan. As a result, it is necessary that its hardware elements be operated with program instructions that are executed in a timely manner by run-time programs. The description components for a scan prescription are downloaded from the workstation 110 in the form of objects. The pulse sequence server 118 contains programs which receive these objects and converts them to objects that are employed by the run-time programs.

The digitized NMR signal samples produced by the RF system 126 are received by the data acquisition server 120. The data acquisition server 120 operates in response to description components downloaded from the workstation 110 to receive the real-time NMR data and provide buffer storage such that no data is lost by data overrun. In some scans the data acquisition server 120 does little more than pass the acquired NMR data to the data processor server 122. However, in scans which require information derived from acquired NMR data to control the further performance of the scan, the data acquisition server 120 is programmed to produce such information and convey it to the pulse sequence server 118. For example, during prescans NMR data is acquired and used to calibrate the pulse sequence performed by the pulse sequence server 118. Also, navigator signals may be acquired during a scan and used to adjust RF or gradient system operating parameters or to control the view order in which k-space is sampled. And, the data acquisition server 120 may be employed to process NMR signals used to detect the arrival of contrast agent in an MRA scan. In all these examples the data acquisition server 120 acquires NMR data and processes it in real-time to produce information which is used to control the scan.

The data processing server 122 receives NMR data from the data acquisition server 120 and processes it in accordance with description components downloaded from the workstation 110. Such processing may include, for example: Fourier transformation of raw k-space NMR data to produce two or three-dimensional images; the application of filters to a reconstructed image; the performance of a backprojection image reconstruction of acquired NMR data; the calculation of functional MR images; the calculation of motion or flow images, etc. As will be described in more detail below, the present invention is implemented by the MRI system in response to a program executed by the data processing server 122.

Images reconstructed by the data processing server 122 are conveyed back to the workstation 110 where they are stored. Real-time images are stored in a data base memory cache (not shown) from which they may be output to operator display 112 or a display 142 which is located near the magnet assembly 130 for use by attending physicians. Batch mode images or selected real time images are stored in a host database on disc storage 144. When such images have been reconstructed and transferred to storage, the data processing server 122 notifies the data store server 123 on the workstation 110. The workstation 110 may be used by an operator to archive the images, produce films, or send the images via a network to other facilities.

Figure 7:
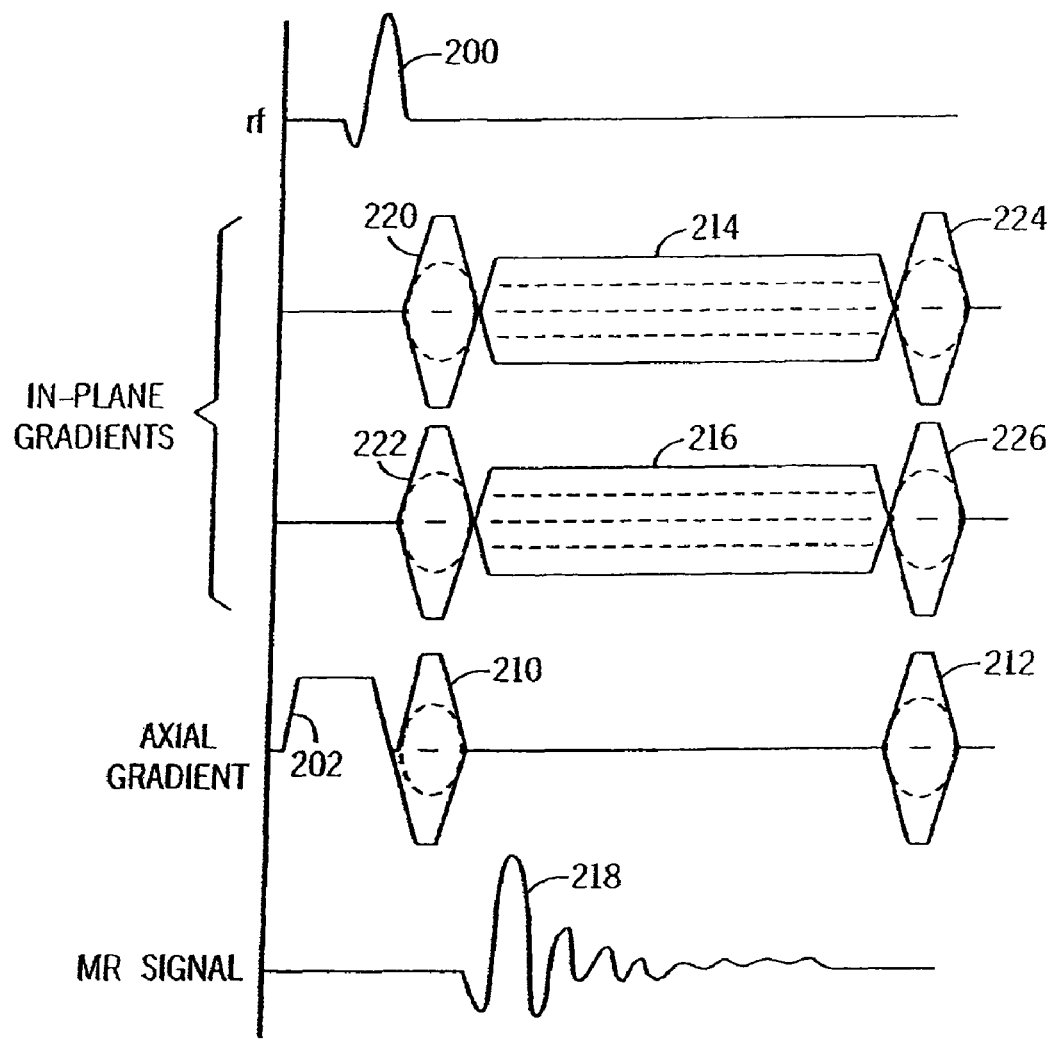
FIG. 7 is a pulse sequence used in the MRI system of FIG. 6 to practice one embodiment of the invention.
Figure 8:
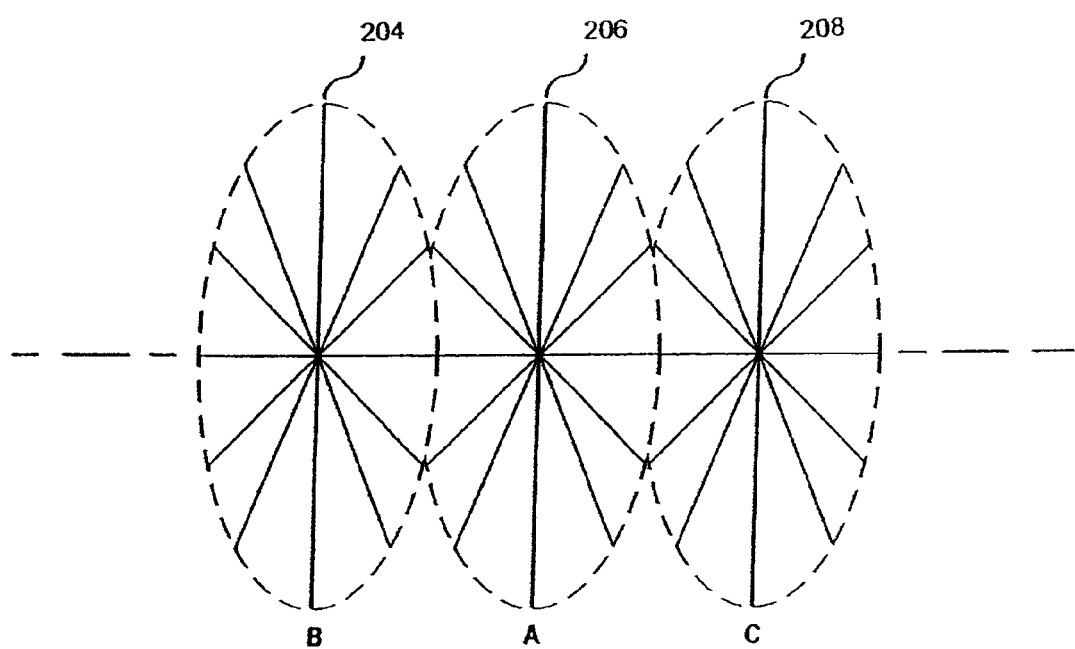
FIG. 8 is a pictorial representation of the k-space data sampled using the pulse sequence of FIG. 7.

To practice the preferred embodiment of the invention NMR data is acquired using a projection reconstruction, or radial, pulse sequence such as that shown in FIG. 7. This is a fast gradient-recalled echo pulse sequence in which a selective, asymmetrically truncated sinc rf excitation pulse 200 is produced in the presence of a slice-select gradient 202. This pulse sequence may be used to acquire a single 2D slice by sampling in a single k-space circular plane, or it may be used to sample a plurality of circular k-space planes as shown at 204, 206 and 208 in FIG. 8. When multiple 2D slices are acquired the gradient 202 is a slab select gradient followed by a phase encoding gradient lobe 210 and a rewinder gradient lobe 212 of opposite polarity. This axial, phase encoding gradient 210 is stepped through values during the scan to sample from each of the 2D k-space planes 204, 206 and 208.

Two in-plane readout gradients 214 and 216 are played out during the acquisition of an NMR echo signal 218 to sample k-space in a 2D plane 204, 206 or 208 along a radial trajectory. These in-plane gradients 214 and 216 are perpendicular to the axial gradient and they are perpendicular to each other. During a scan they are stepped through a series of values to rotate the view angle of the radial sampling trajectory as will be described in more detail below. Each of the in-plane readout gradients is preceded by a prephasing gradient lobe 220 and 222 and followed by a rewinder gradient lobe 224 and 226.

It should be apparent to those skilled in the art that sampling trajectories other than the preferred straight line trajectory extending from one point on the k-space peripheral boundary, through the center of k-space to an opposite point on the k-space peripheral boundary may also be used. As mentioned above, one variation is to acquire a partial NMR echo signal 218 which samples along a trajectory that does not extend across the entire extent of the sampled k-space volume. Another variation which is equivalent to the straight line projection reconstruction pulse sequence is to sample along a curved path rather than a straight line. Such pulse sequences are described, for example, in "Fast Three Dimensional Sodium Imaging", MRM, 37:706-715,1997 by F. E. Boada, et al. and in "Rapid 3D PC-MRA Using Spiral Projection Imaging", Proc. Intl. Soc. Magn. Reson. Med. 13 (2005) by K. V. Koladia et al and "Spiral Projection Imaging: a new fast 3D trajectory", Proc. Intl. Soc. Mag. Reson. Med. 13 (2005) by J. G. Pipe and Koladia. It should also be apparent that the present invention may be employed with 3D as well as 2D versions of these sampling methods and use of the term "pixel" herein is intended to refer to a location in either a 2D or a 3D image.

The MRI system described above can be used in a wide variety of clinical applications to acquire either 2D or 3D sets of projection views that may be used to reconstruct one or more images. The image reconstruction method of the present invention is particularly useful in scans where one or more image frames are reconstructed using less than all the acquired projection views.

Figure 10:
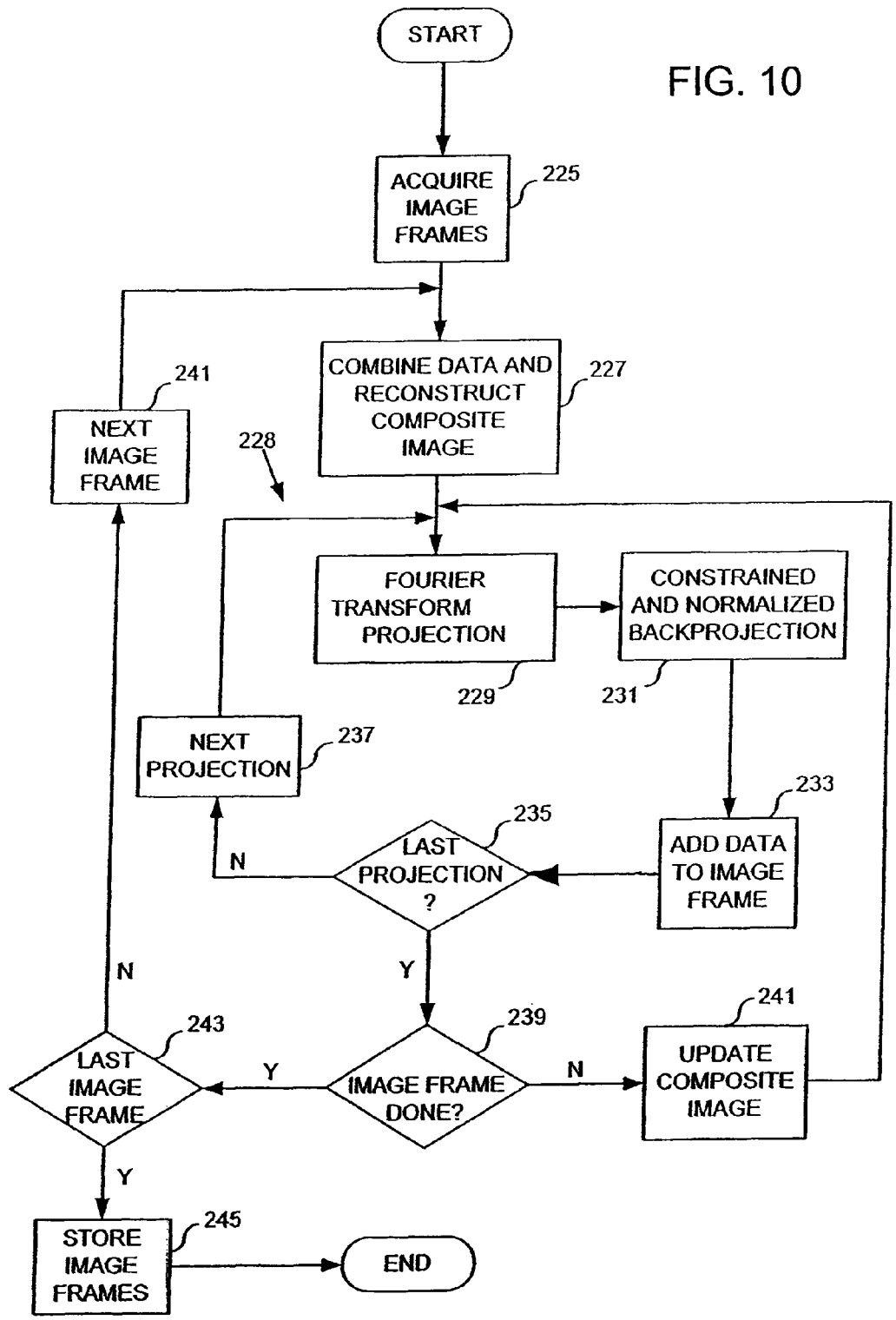
FIG. 10 is a flow chart of a preferred embodiment of the invention used in the MRI system of FIG. 6 with the pulse sequence of FIG. 7.

The first embodiment of the image reconstruction method directs the MRI system to acquire projection views and reconstruct a series of image frames that depict the subject over a period of time. Referring particularly to FIG. 10, sets of projection views are acquired from which a series of image frames are to be reconstructed as indicated at process block 225. The projection views in each set are few in number (e.g., 10 views) and evenly distributed to sample k-space as uniformly as possible as illustrated in FIG. 2. Because of the low number of projection views that are acquired, this image frame can be acquired in a very short scan time, but because k-space is highly undersampled, streak artifacts will occur in any image reconstructed using conventional methods.

The next step as indicated at process block 227 is to combine projection views that have been acquired from the subject of the examination and reconstruct a composite image. This will typically include projection views acquired in a time window surrounding the current time frame and which are interleaved with the views for the current image frame. The composite image projections are much larger in number than the image frame data set and the composite image data set provides a more complete sampling of k-space. As a result, the reconstructed composite image has a high signal-to-noise ratio (SNR) and streak artifacts are suppressed. In the preferred embodiment this reconstruction includes regridding the combined k-space projection data into Cartesian coordinates and then performing an inverse Fourier transformation to produce the composite image.

Figure 4:
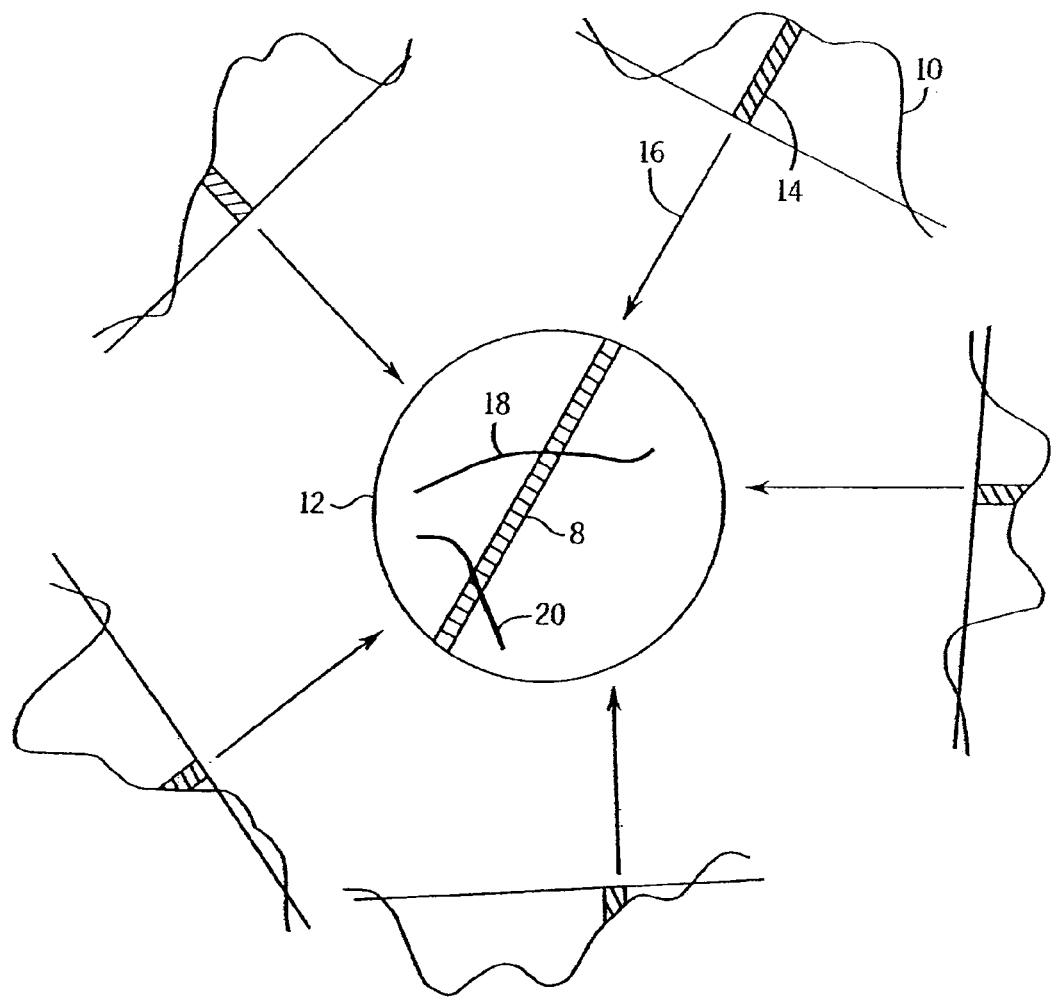
FIG. 4 is a pictorial representation of the highly constrained 2D backprojection step according to the present invention.
Figure 5:
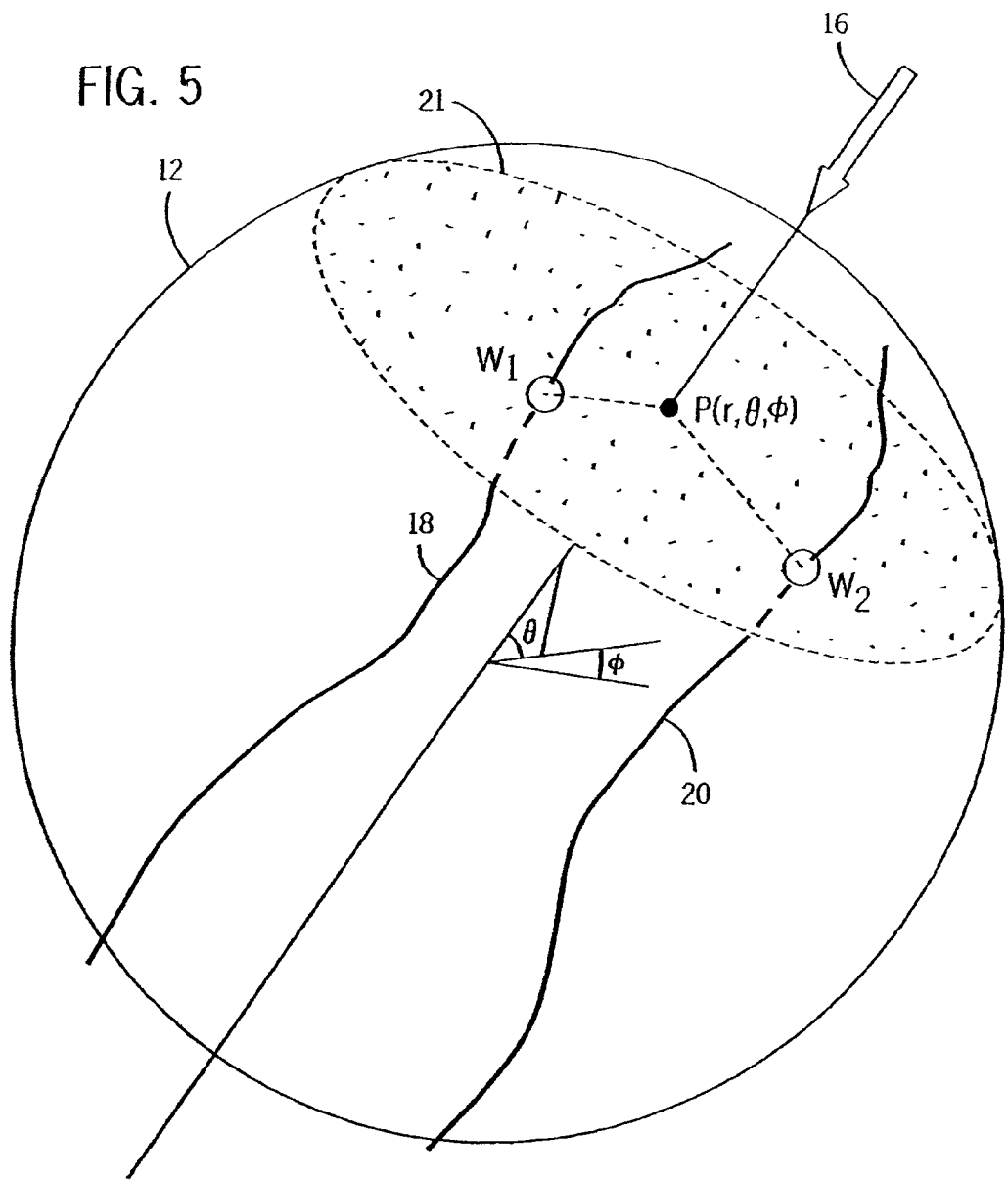
FIG. 5 is a pictorial representation of the highly constrained 3D backprojection according to the present invention.

A loop is then entered at 228, in which each projection view in the current image frame is backprojected according to the teachings of the HYPR invention. More specifically, the k-space projection view is first transformed to Radon space by performing a one-dimensional, fast Fourier inverse transformation as indicated at process block 229. The transformed projection is then backprojected as indicated at process block 231. This highly constrained backprojection is performed as described above in equation (2) and shown in FIG. 4 using the recently reconstructed composite image. This is a highly constrained backprojection and normalization step. As indicated at process block 233, the resulting backprojected values are added to the image frame being reconstructed and a test is made at decision block 235 to determine if all of the projection views for the current image frame have been backprojected. If not, the next projection view is processed as indicated at process block 237, and when all the projection views for the current image frame have been processed an image frame is produced according to the HYPR method.

In accordance with the present invention the HYPR reconstruction is repeated a number of times to further refine the reconstructed image frame. More specifically a test is made at decision block 239 to determine if additional iterations should be done. This test may be as simple as counting the number of iterations performed (e.g., 4 or 5 iterations), or it may involve the calculation of an image quality factor that must be reached such as the sum of the squared difference between the reconstructed data to the measured projection data. In any case, when an additional iteration is to be performed the composite image is updated with the most recent HYPR frame image as indicated at process block 241, and the HYPR reconstruction loop 228 is reentered to produce another HYPR image frame. Thus, an initial HYPR image frame is produced using the initial composite image, and the composite image is updated after each iteration with the HYPR image frame produced during that iteration. The original image frame projections are used for each iteration of the HYPR reconstruction process and the sequence of reconstructed HYPR image frames converges to a high SNR image that depicts the subject at the moment in time the initial image frame was acquired.

Referring still to FIG. 10, a variation in this method which enables convergence to the final image with less computation time updates the composite image more often. Rather than Fourier transforming and backprojecting all the projections in the current image frame at process blocks 229 and 231 during each iteration, a subset of the image frame projections may be processed between each update of the composite image at process block 241. More specifically, a partial updated composite image is produced with a selected subset of the image frame projections and this partial updated composite image is combined with the previously produced partial updated composite images for the remaining subsets of image frame projections. For example, if 30 projection views are acquired for each image frame, three subsets of 10 projection views each may be selected. Rather than backprojecting all 30 projection views during each iteration through process block 231 only 10 views are backprojected in roughly one-third the processing time. The partial updated composite image that results is combined with the previous two partial updated composite images resulting from the other 20 projection views, and this updated composite image is used during the next iteration of 10 projection views. In this example the composite image is updated three times as fast for about the same amount of computations as processing the entire set of image frame projections together. This higher composite image update rate causes convergence to the final image faster.

If multiple receiver channels are used to collect the MR data for a parallel reconstruction method such as SENSE, SMASH or GRAPPA, each channel of data is processed using a probability density map of MR signal values derived from the receiver coil sensitivity profile. This probability weighting of the reconstructed image frame can be included in the constrained and normalized backprojection of process block 231 as further "a priori" information that weights the highly constrained image to further accelerate convergence.

Referring still to FIG. 10, when the iterative HYPR image frame reconstruction is completed as determined at decision block 239, a test is made at decision block 243 to determine if additional image frames are to be produced. If so, the system loops back through process block 241 to reconstruct another composite image as indicated at process block 237. In a dynamic study of a subject, for example, a series of image frames are acquired and reconstructed to depict how the subject changes over a period of time. The projection views acquired during the study are interleaved with each other so that they sample different parts of k-space and a composite image is formed by combining projection views that were acquired in a time window centered on the image frame being HYPR reconstructed. The width of this temporal window is set to include enough projection views to adequately sample k-space without unduly reducing the temporal resolution of the image frame. It has been discovered that the iterative HYPR reconstruction in accordance with the present invention enables more projection views to be combined in the composite image without unduly reducing the temporal resolution of the reconstructed image frame. This more robust initial composite image results in a higher SNR and fewer undersampling artifacts in the final image.

In the preferred embodiment a new composite image is reconstructed at process block 227 as the initial estimate for each image frame. However, in some clinical applications a single composite image is reconstructed and used as the initial guess for all the image frames.

As indicated at process block 245, when the last image frame has been reconstructed as determined at decision block 243, the reconstructed image frames are stored. The stored image frames may be displayed one at a time or played out in sequence to show how the subject changes during the dynamic study.

The initial composite may be acquired and reconstructed in a number of different ways depending on the clinical application. In the above embodiment of the invention the initial composite image is reconstructed from interleaved views acquired within a time window centered about the acquisition time of the image frame being reconstructed. This is particularly applicable to situations in which there is subject motion or substantial changes in the subject during the dynamic study. In other clinical applications the initial composite image may be acquired during a separate scan that is not time constrained and in which k-space is fully sampled. This enables a high resolution, high SNR anatomical image of the subject to be acquired and used as the initial composite image. It reduces the required number of projection views acquired during the dynamic process, thus increasing the temporal resolution of the dynamic study.

Figure 11:
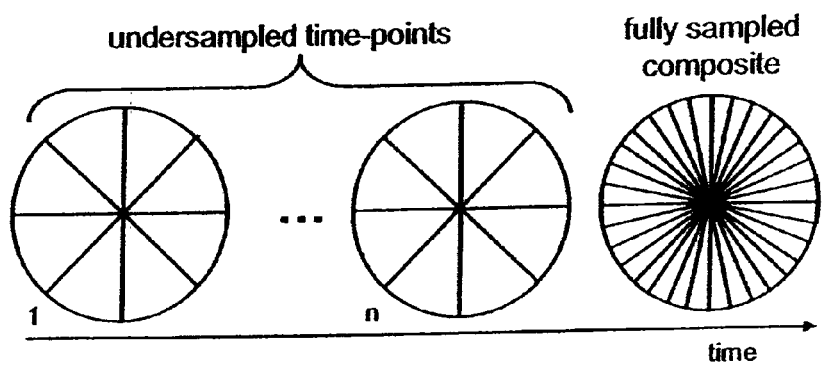
FIGS. 11 and 12 are pictorial representations of preferred embodiments of k-space data acquisition applied to two types of blood perfusion studies.
Figure 12:
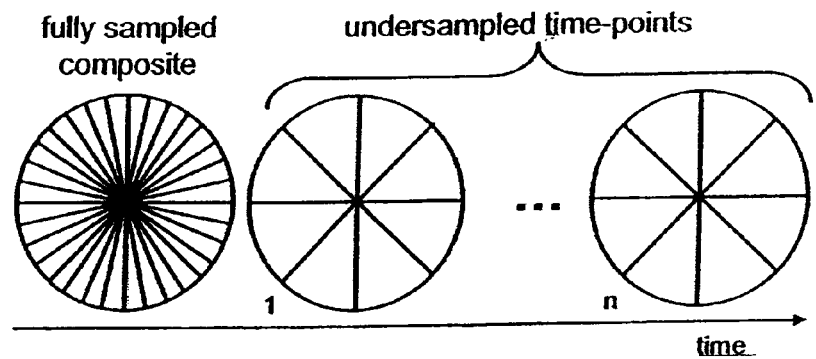

The iterative method of the present invention produces an image that converges to a highly accurate MR measurement at each image pixel. Referring particularly to FIGS. 11 and 12, for tumor perfusion imaging, for example, the composite image may be acquired before or after the vascular space of interest has filled up with contrast agent. The undersampled image frames are acquired while the contrast is being taken up and washed out of the vasculature space of interest, and because few projection views are acquired for each time point image frame (e.g., from 16 to 32 projections) a very high temporal resolution is achieved.

Figure 13:
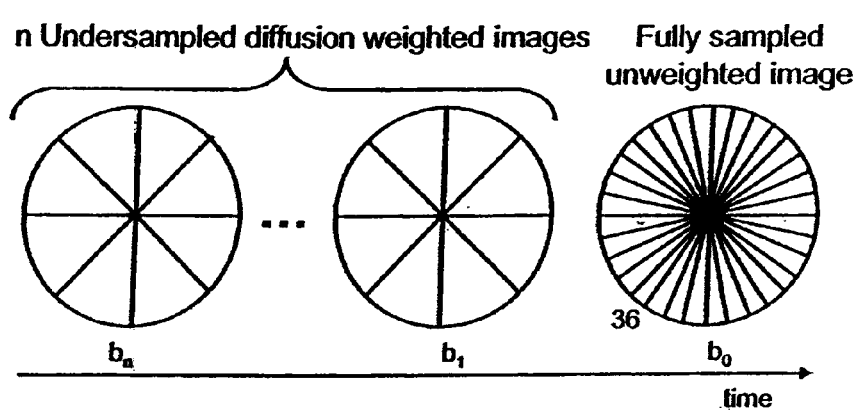
FIG. 13 is a pictorial representation of a diffusion-weighted image acquisition.

As shown in FIG. 13, in a diffusion weighted scan with multiple weights, a fully sampled unweighted composite image is acquired after a series of diffusion weighted image frames are acquired. The unweighted composite image is used as the initial composite image for each image frame reconstruction and an accurate diffusion-weighted image results after the iterative HYPR process is completed.

Another way to view the iterative HYPR reconstruction process is that an initial, high resolution, high SNR, fully sampled composite image of the anatomy is acquired, and it is modified by the iterative HYPR process to properly depict the state (e.g., appearance, or motion or diffusion) at specific time points during the dynamic study. These time points are the times during which the individual image frames are acquired.

The above described embodiments demonstrate the application of the present invention to MRI in which a plurality of views are acquired to sample k-space and used to reconstruct an image. The invention also applies to other imaging modalities which acquire a plurality of views of the subject and reconstruct a tomographic image therefrom, such as x-ray CT, SPECT and PET.

The present invention is also applicable to imaging modalities that do not perform a tomographic image reconstruction. Such modalities include, for example, x-ray fluoroscopy and ultrasound imaging in which a series of image frames are acquired and HYPR processed as described in copending U.S. Patent Application Ser. No. 60/901,728, filed on Feb. 19, 2007, and entitled "Localized and Highly Constrained Image Reconstruction Method", and in copending U.S. Patent Application Ser. No. 60/972,828, filed on Sep. 17, 2007 and entitled "Method For Producing Highly Constrained X-Ray Radiograph Images". In these clinical applications a "view" of the subject is a complete image frame and the HYPR processing is applied to each image frame view to enhance its SNR or suppress image artifacts rather than reconstruct an image.

Figure 14A:
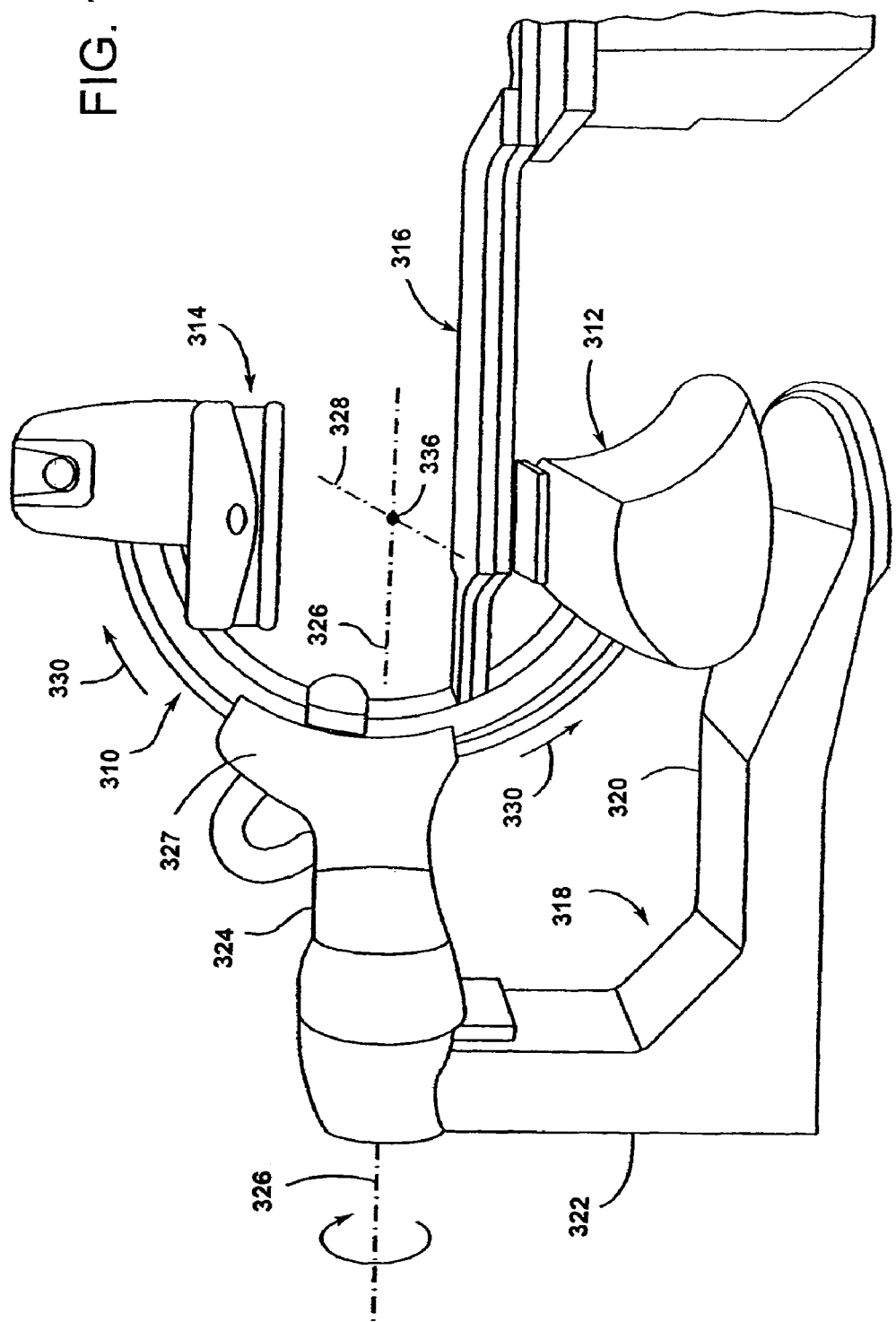
FIGS. 14A and 14B are perspective views of an x-ray system which employs a preferred embodiment of the present invention.
Figure 14B:
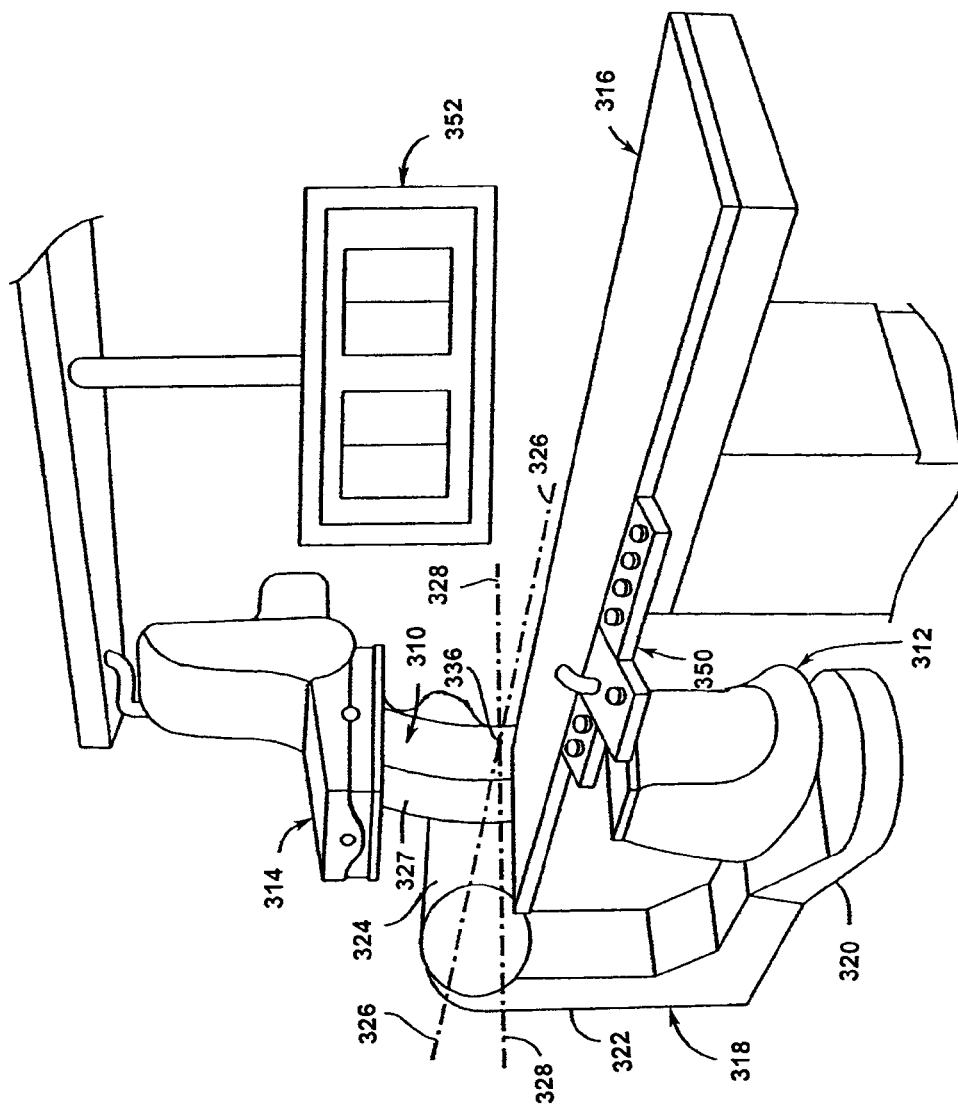
Figure 15:
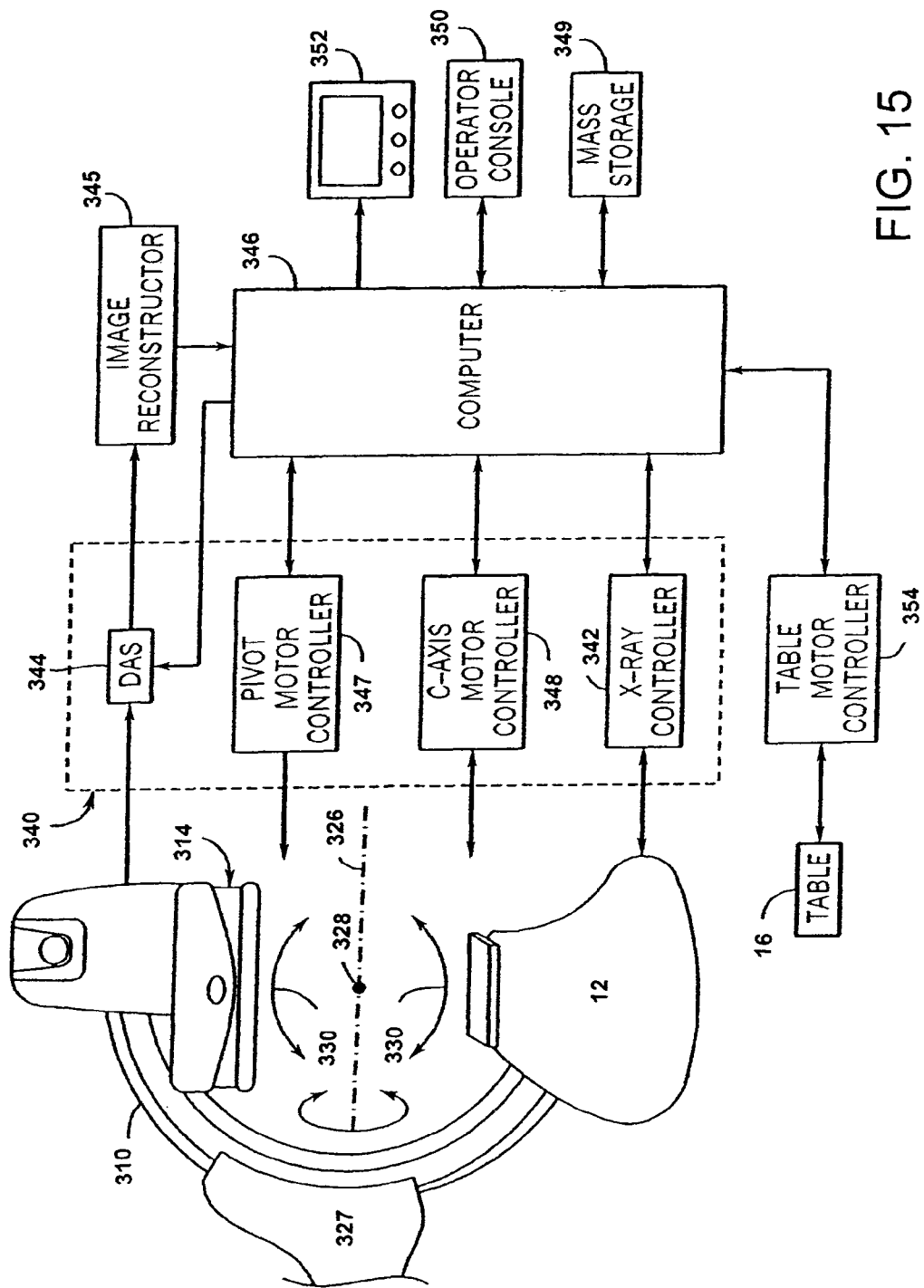
FIG. 15 is a schematic block diagram of the x-ray system of FIG. 14.
Figure 16:
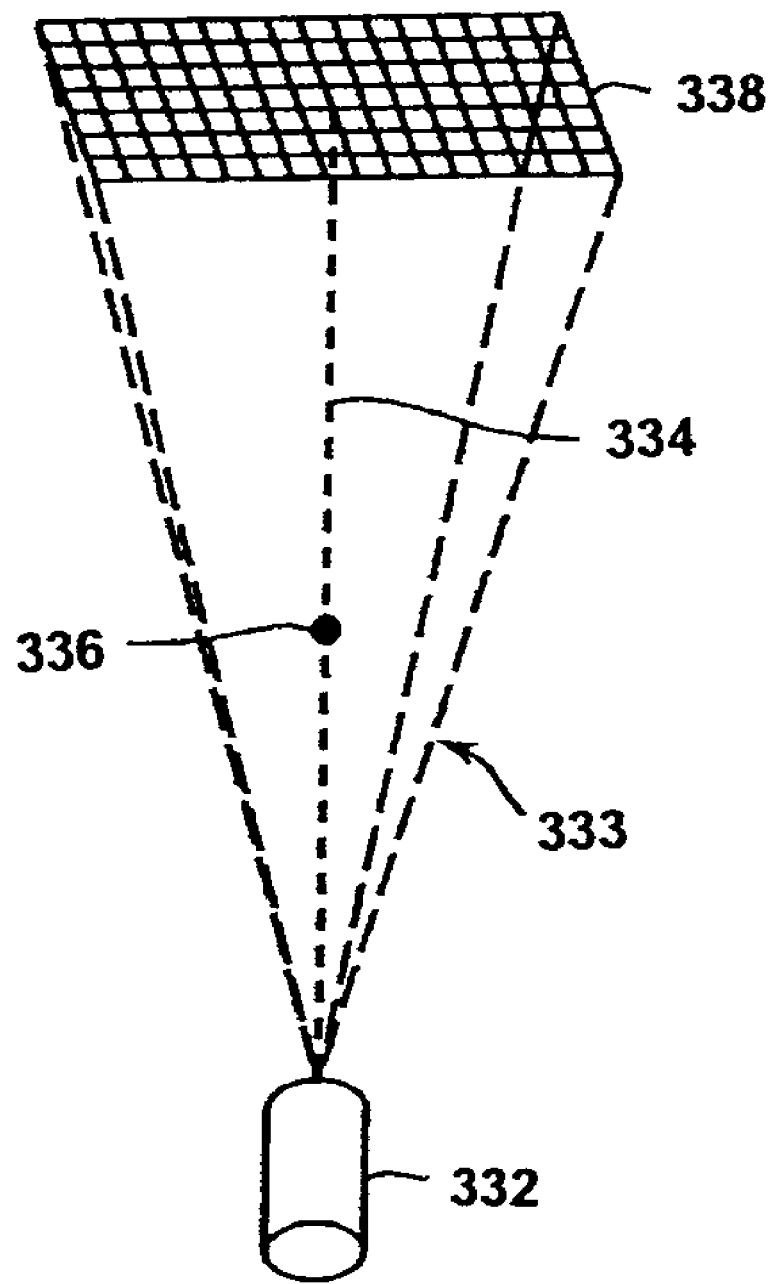
FIG. 16 is a pictorial view of an x-ray source and detector array which forms part of the x-ray system of FIG. 14.

Referring particularly to FIGS. 14 and 15, an x-ray system that may be used to acquire x-ray radiograph images for performing fluoroscopy and digital subtraction angiography is shown. It is characterized by a gantry having a C-arm 310 which carries an x-ray source assembly 312 on one of its ends and an x-ray detector array assembly 314 at its other end. The gantry enables the x-ray source 312 and detector 314 to be oriented in different positions and angles around a patient disposed on a table 316, while enabling a physician access to the patient to perform a procedure.

The gantry includes an L-shaped pedestal 318 which has a horizontal leg 320 that extends beneath the table 316 and a vertical leg 322 that extends upward at the end of the horizontal leg 320 that is spaced from of the table 316. A support arm 325 is rotatably fastened to the upper end of the vertical leg 322 for rotation about a horizontal pivot axis 326. The pivot axis 326 is aligned with the centerline of the table 316 and the arm 324 extends radially outward from the pivot axis 326 to support a C-arm drive assembly 327 on its outer end. The C-arm 310 is slidably fastened to the drive assembly 327 and is coupled to a drive motor (not shown) which slides the C-arm 310 to revolve it about a C-axis 328 as indicated by arrows 330. The pivot axis 326 and C-axis 328 intersect each other at an isocenter 336 located above the table 316 and they are perpendicular to each other.

The x-ray source assembly 312 is mounted to one end of the C-arm 310 and the detector array assembly 314 is mounted to its other end. As will be discussed in more detail below, the x-ray source 312 emits a cone beam of x-rays which are directed at the detector array 314. Both assemblies 312 and 314 extend radially inward to the pivot axis 326 such that the center ray of this cone beam passes through the system isocenter 336. The center ray of the cone beam can thus be rotated about the system isocenter around either the pivot axis 326 or the C-axis 328, or both during the acquisition of x-ray attenuation data from a subject placed on the table 316.

As shown in FIG. 15, the x-ray source assembly 312 contains an x-ray source 332 which emits a cone beam 333 of x-rays when energized. The center ray 334 passes through the system isocenter 336 and impinges on a two-dimensional flat panel digital detector 338 housed in the detector assembly 314. The detector 338 is a 2048 by 2048 element two-dimensional array of detector elements having a size of 41 cm by 41 cm. Each element produces an electrical signal that represents the intensity of an impinging x-ray and hence the attenuation of the x-ray as it passes through the patient. The detector array is able to acquire up to 30 radiograph frames per second to depict the procedure being performed in real time.

Referring particularly to FIG. 15, the orientation of the assemblies 312 and 314 and the operation of the x-ray source 332 are governed by a control mechanism 340 of the system. The control mechanism 340 includes an x-ray controller 342 that provides power and timing signals to the x-ray source 332. A data acquisition system (DAS) 44 in the control mechanism 340 samples data from detector elements 338 in some modes of operation and passes the data to an image reconstructor 345. The image reconstructor 345, receives digitized x-ray data from the DAS 44 and performs high speed image reconstruction in some modes of system operation. When operated in the radiograph mode, however, the data is passed directly through as a radiograph image frame. The 2D radiograph image is applied as an input to a computer 346 which performs the highly constrained image processing according to the present invention, stores the image in a mass storage device 349 and displays the image on a 2D display 352.

The control mechanism 340 also includes pivot motor controller 347 and a C-axis motor controller 348. In response to motion commands from the computer 346 the motor controllers 347 and 348 provide power to motors in the x-ray system that produce the rotations about respective pivot axis 326 and C-axis 328. These motion commands are produced in response to manual input from the attending physician.

The computer 346 also receives commands and scanning parameters from an operator via console 350 that has a keyboard and other manually operable controls. The associated display 352 allows the operator to observe the image and other data from the computer 346. The operator supplied commands are used by the computer 346 under the direction of stored programs to provide control signals and information to the DAS 344, the x-ray controller 342 and the motor controllers 347 and 348. In addition, computer 346 operates a table motor controller 354 which controls the motorized table 316 to position the patient with respect to the system isocenter 336.

The above described x-ray system may be operated in a fluoroscopic mode to produce two-dimensional radiograph images in real time. Typically, this mode is used when a procedure such as catherization is performed on the patent and the fluoroscopic images are used to help guide the procedure. The requirements are image frames produced with an SNR sufficient to see the instrument being guided and the surrounding anatomy, with a frame rate sufficient to provide near realtime images of the procedure, and with an x-ray dose as low as possible.

Figure 17:
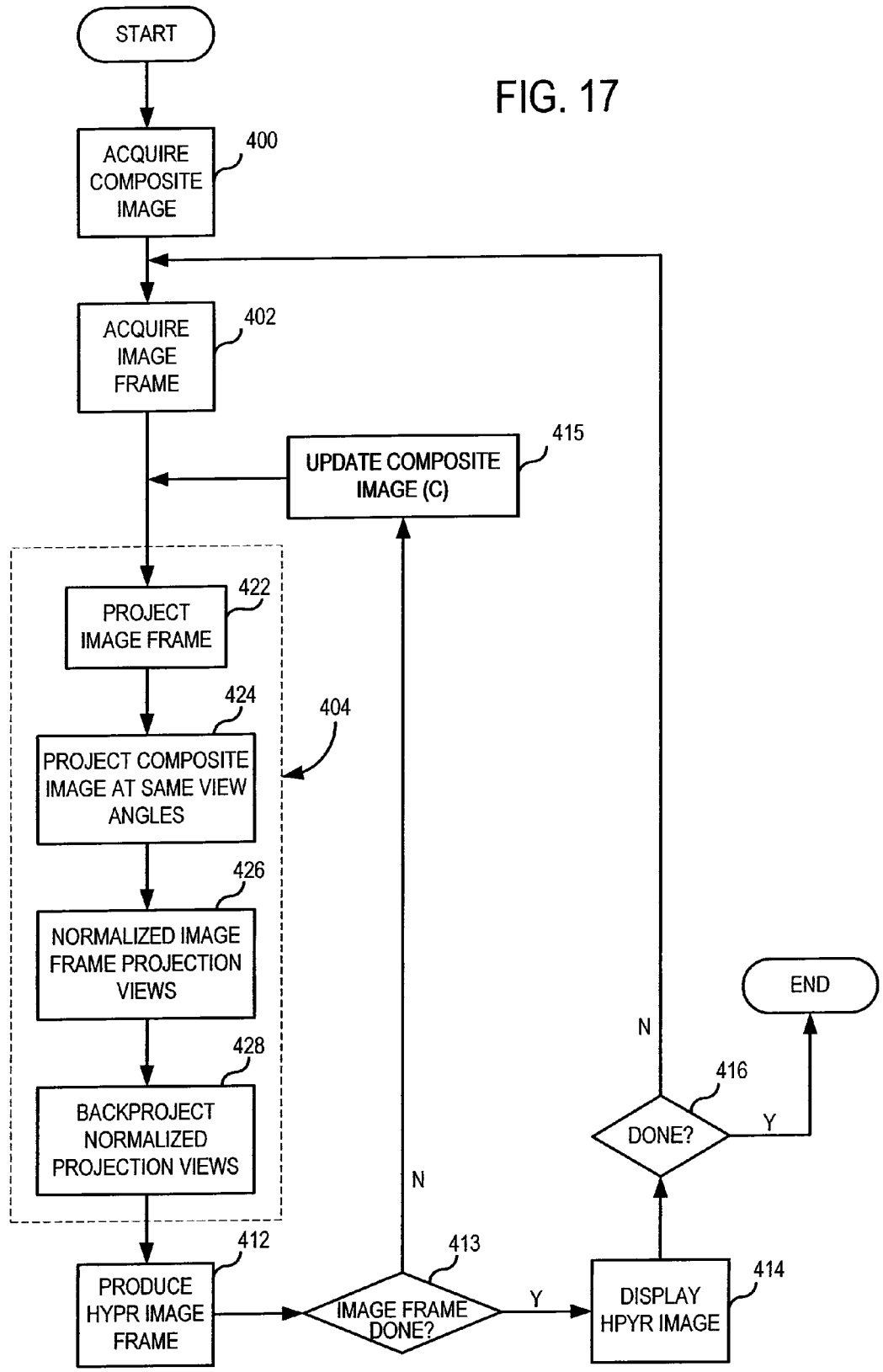
FIG. 17 is a flow chart which describes the steps used to HYPR process acquired image frames.

Referring particularly to FIGS. 1 and 17, the highly constrained image processing is carried out by a program executed by the computer 346 on acquired 2D radiograph image frames 2. Prior to the acquisition of the 2D radiograph images 2, however, a high quality composite image of the region of interest in the subject being examined is acquired as indicated at process block 400. This is an anatomic image of the highest quality possible with a very high SNR. For example, it may be an x-ray image acquired with a much higher x-ray dose than that used during the real time procedure. This is done before the real time procedure is started and scan time is not of great concern. A loop is then entered when the real time procedure begins and 2D radiograph images are acquired as indicated at process block 402 and processed using the present invention as described below.

As indicated generally at 404, the next step after acquiring an image frame is to produce a normalized weighting image using the current 2D radiograph image frame 2 and the composite image 3. There are a number of different ways to perform this step and the preferred method is shown in FIG. 17. This method transforms the acquired 2D radiograph image frame 2 to Radon space by taking projection views of the image from different view angles as indicated at process block 422. As indicated at process block 424, the composite image 3 is also transformed to Radon space by calculating projection views at the same set of view angles used to transform the 2D radiograph image frame 2. As indicated at process block 426 the image frame projection views P are then normalized by dividing them by the composite image projection views $P_c$. This is a division of corresponding elements in the projections P and $P_c$ at the same view angle. The normalized weighting image ($T_w$) is then produced at process block 428 by backprojecting the normalized projections (P/$P_c$) in a conventional manner. This is not a filtered backprojection, but a straight forward backprojection.

As indicated at process block 412, a highly constrained (HYPR) image frame 4 is then produced. This image frame 4 is produced by multiplying the updated image array 3 by the normalized weighting image array ($T_w$). This is a multiplication of corresponding pixel values in the two images.

The next step as indicated at decision block 413 is to determine if the final image frame is completed. If not, as indicated at process block 415, the composite image is updated by substituting for the original composite image the most recent non-final image frame produced at process block

412. The system then loops back to repeat the HYPR processing beginning at process block 406. This iterative process is repeated until the final image frame reaches the desired quality as determined at decision block 413. The decision at block 413 can be made based on a measure of data consistency such as the sum of the squared difference between the reconstructed data and the measured projection data or by reaching a predetermined number of iterations.

The final image frame is displayed as indicated at process block 414 and the system loops back to acquire another image frame 2 at process block 402 and begin the iterative processing again. The originally acquired composite image 3 is used during the initial iteration of subsequent image frames 2 and it is updated after each iteration as described above. After the final image frame 2 has been acquired, processed and displayed, the procedure terminates as indicated at decision block 416.

Figure 18:
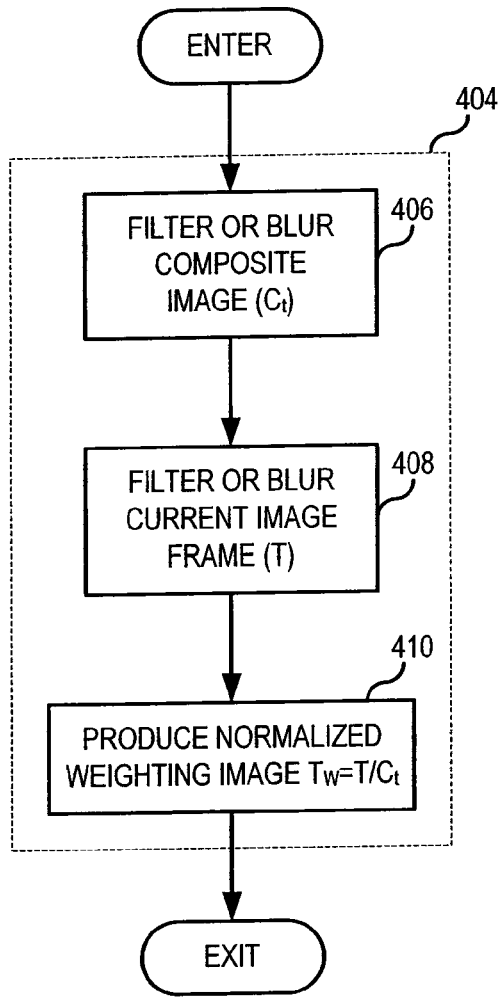
FIG. 18 is a first alternative method for producing a normalized weighting image in the process of FIG. 17.
Figure 19:
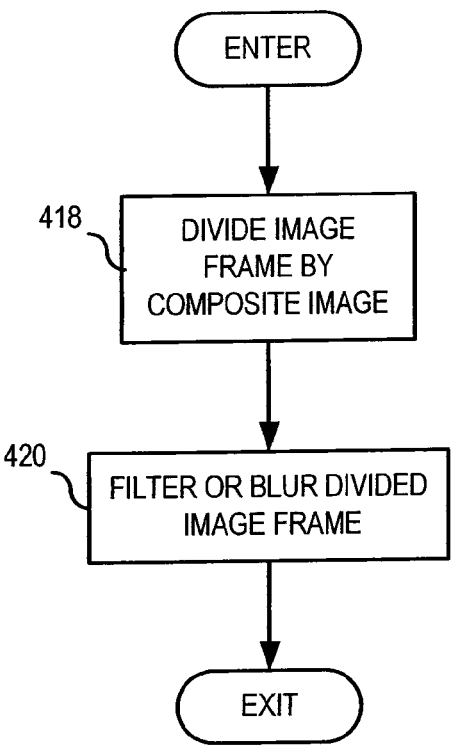
FIG. 19 is a second alternative method for producing a normalized weighting image in the process of FIG. 17.

As indicated above, there are a number of alternative methods for producing the normalized weighting image ($W_T$). Two of these methods are illustrated in FIGS. 18 and 19. Referring particularly to FIG. 18, with the first alternative method the composite image 3 is "blurred" by filtering as indicated at process block 406. More specifically, the filtering is a convolution process in which the 2D composite image array 3 is convolved with a filter kernel. In the preferred embodiment the filter kernel is a 7×7 square filter kernel. The kernel size should be selected so that when the blurring is done the kernel does not include much information from outside the subject of interest (for example a blood vessel). The filter kernel should be on the order of the dimension of the objects being examined or somewhat smaller. Gaussian or other smooth filter kernels may also be used and the resulting filter function being performed is essentially low pass filtering.

Referring still to FIG. 18, the current 2D image frame 2 is also blurred or filtered in the same manner as indicated at process block 408. That is, the 2D radiograph image frame array 2 is convolved with the filter kernel to perform a low pass filtering function. As indicated at process block 410, the normalized weighting image ($T_w$) is then produced by dividing pixel values in the filtered current image frame (T) by the corresponding pixel values in the filtered composite image ($C_t$).

Another embodiment shown in FIG. 19 includes a first step indicated at process block 418 of dividing the acquired 2D radiograph image frame array 2 by the updated composite image (C) 3. This is a division of every pixel value in the acquired image frame array 2 by the corresponding pixel value in the updated composite image array 3. The resulting 2D divided image frame is then blurred or filtered as indicated at process block 420 to produce the normalized weighting image ($T_w$). This filtering operation is the same convolution process discussed above with respect to process blocks 406 and 408.

The iterative HYPR processing of the present invention can be used on many different imaging systems and employed in many different clinical applications. It can be used to enhance image construction and it can be used to enhance images that already exist.

The invention claimed is:

1. A method for producing an image of a subject positioned in a field of view (FOV) of an imaging system, the steps comprising:
    a) acquiring with the imaging system a view of the subject positioned in the FOV;
    b) producing a composite image of the subject which provides a priori knowledge of the subject to be imaged;
    c) performing highly constrained processing of the view acquired in step a), using the a priori knowledge of the subject embodied in the composite image; and
    d) repeating step c) a plurality of iterations to produce a final image of the subject in which the image that results during one iteration is employed as the composite image in the next iteration.

2. The method as recited in claim 1 in which a plurality of views of the subject are acquired in step a) and the process in step c) is an image reconstruction which includes:
    c)i) backprojecting a view into the FOV; and
    c)ii) weighting the value backprojected into each FOV image pixel based on the a priori knowledge of the subject at the image pixel.

3. The method as recited in claim 2 in which step c)ii) includes:
    multiplying each backprojected image pixel value by a value in the composite image; and
    normalizing the product of said multiplication.

4. The method as recited in claim 3 in which step c)ii) also includes weighting the image pixels based on a priori knowledge of a receiver channel sensitivity profile for a receiver channel used to acquire the plurality of views in step a).

5. The method as recited in claim 2 in which the imaging system is a magnetic resonance imaging system and step c) includes Fourier transforming a selected view prior to backprojection in step c)i).

6. The method as recited in claim 1 in which step a) includes acquiring a plurality of views of the subject and step c) includes:
    c)i) producing an image from views acquired in step a);
    c)ii) producing a highly constrained image of the subject in the FOV by multiplying values at each image pixel location by a corresponding pixel value in the composite image; and
    c)iii) normalizing the highly constrained image using information in the composite image.

7. The method as recited in claim 6 in which the image is formed from views acquired in step a) that depict the subject in the FOV from a set of projection angles and the highly constrained image is normalized in step c)iii) by:
    calculating a projection of the composite image at each of the projection angles; and
    dividing each pixel value in the highly constrained image by a value in each of the composite image projections.

8. The method as recited in claim 7 in which each pixel value in the highly constrained image is weighted by a value derived from a sensitivity profile of a receiver channel used to acquire the views in step a).

9. The method as recited in claim 6 in which the views acquired in step a) are acquired over a period of time during which changes occur in the subject; step c)i) includes selecting a set of views acquired during a time interval in the performance of step a); and step b) includes selecting a set of views acquired in step a) during a window of time that includes said time interval and that is longer than said time interval and reconstructing the composite image from the selected views.

10. The method as recited in claim 1 which includes:
    repeating step a) to acquire a plurality of views of the subject; and
    producing additional images of the subject by repeating steps c) and d) using different ones of the views acquired in step a).

11. The method as recited in claim 10 in which the views acquired in step a) are projection views acquired at different view angles.

12. The method as recited in claim 1 in which the imaging system is a magnetic resonance imaging system and steps b) and c) are performed with complex values.

13. The method as recited in claim 1 in which step a) is performed while a contrast agent flows into the FOV; and step b) includes acquiring a high quality anatomic image of the subject; and wherein the final image is a perfusion image.

14. The method as recited in claim 13 in which step a) is performed a plurality of times as contrast agent flows into the FOV and steps c) and d) are performed a plurality of times to produce a corresponding plurality of perfusion images.

15. The method as recited in claim 1 in which step a) is performed with a pulse sequence that diffusion weights the acquired view; and step b) includes acquiring a high quality anatomic image of the subject; and wherein the final image produced in step d) is a diffusion weighted image.

16. The method as recited in claim 15 in which step a) is performed a plurality of times with different diffusion weighting and steps c) and d) are performed a plurality of times to produce a corresponding plurality of different diffusion weighted images.

17. The method as recited in claim 1 in which the view acquired in step a) is a radiograph image, the composite image produced in step b) is a higher quality image of the subject than the radiograph image, and the processing in step c) improves the quality of the radiograph image.

18. The method as recited in claim 17 in which step a) is repeated to acquire a plurality of radiograph images and steps c) and d) are repeated to improve the quality of each radiograph image.

19. The method as recited in claim 18 in which the imaging system is an x-ray imaging system.

20. The method as recited in claim 17 in which step c) includes:
   c)i) blurring the radiograph image with a filter function;
   c)ii) blurring the composite image with a filter function;
   c)iii) dividing the blurred radiograph image by the blurred composite image to produce a normalized weighting image; and
   c)iv) multiplying pixel values in the normalized weighting image by corresponding pixel values in the composite image.

21. The method as recited in claim 20 in which the blurring is performed by convolving each image with a filter kernel.

* * * * *